(12) United States Patent
Sasaki et al.

(10) Patent No.: US 8,063,437 B2
(45) Date of Patent: Nov. 22, 2011

(54) SEMICONDUCTOR DEVICE AND METHOD FOR PRODUCING THE SAME

(75) Inventors: Yuichiro Sasaki, Osaka (JP); Katsumi Okashita, Osaka (JP); Keiichi Nakamoto, Osaka (JP); Hisataka Kanada, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 386 days.

(21) Appl. No.: 12/193,861

(22) Filed: Aug. 19, 2008

(65) Prior Publication Data

US 2009/0026540 A1   Jan. 29, 2009

Related U.S. Application Data

(63) Continuation of application No. PCT/JP2008/000303, filed on Feb. 22, 2008.

(30) Foreign Application Priority Data

Jul. 27, 2007   (JP) .................. 2007-195860

(51) Int. Cl.
   *H01L 29/66* (2006.01)
(52) U.S. Cl. .. 257/327; 257/344; 257/347; 257/E51.005
(58) Field of Classification Search .......... 257/327–329, 257/344, 347–349, E51.005
   See application file for complete search history.

(56) References Cited

U.S. PATENT DOCUMENTS

| 4,912,065 | A | 3/1990 | Mizuno et al. |
| 7,138,305 | B2 * | 11/2006 | Datta et al. .................. 438/157 |
| 7,800,165 | B2 | 9/2010 | Sasaki et al. |
| 2004/0036038 | A1 | 2/2004 | Okumura et al. |
| 2005/0116218 | A1 | 6/2005 | Yang |
| 2005/0280102 | A1 | 12/2005 | Oh et al. |

(Continued)

FOREIGN PATENT DOCUMENTS

JP   01-295416   11/1989

(Continued)

OTHER PUBLICATIONS

Khajetoorians, A. A., et al., "Dopant characterization of fin field-effect transistor structures using scanning capaciktance microscopy", J. Appl. Phys, Feb. 9, 2007, vol. 101 No. 3, American Institute of Physics.

(Continued)

*Primary Examiner* — Evan Pert
*Assistant Examiner* — Scott Wilson
(74) *Attorney, Agent, or Firm* — McDermott Will & Emery LLP

(57) ABSTRACT

A semiconductor device includes: a first semiconductor region formed on a substrate and having an upper surface and a side surface; a first impurity region of a first conductivity type formed in an upper portion of the first semiconductor region; a second impurity region of a first conductivity type formed in a side portion of the first semiconductor region; and a gate insulating film formed so as to cover at least a side surface and an upper corner of a predetermined portion of the first semiconductor region. A radius of curvature r' of an upper corner of a portion of the first semiconductor region located outside the gate insulating film is greater than a radius of curvature r of an upper corner of a portion of the first semiconductor region located under the gate insulating film and is less than or equal to 2r.

22 Claims, 18 Drawing Sheets

U.S. PATENT DOCUMENTS

| | | |
|---|---|---|
| 2006/0084204 A1 | 4/2006 | Yin et al. |
| 2006/1015774 | 7/2006 | Okuno |
| 2006/0220131 A1 | 10/2006 | Kinoshita et al. |
| 2007/0004117 A1 | 1/2007 | Yagishita |
| 2007/0082437 A1 | 4/2007 | Cheng et al. |
| 2007/0090408 A1 | 4/2007 | Majumdar et al. |
| 2007/0096196 A1 | 5/2007 | Hofmann et al. |
| 2007/0148836 A1 | 6/2007 | Cheng et al. |
| 2007/0155075 A1 | 7/2007 | Kim et al. |
| 2007/0158700 A1 | 7/2007 | Koh et al. |
| 2007/0184627 A1* | 8/2007 | Cho et al. ................. 438/399 |
| 2007/0210355 A1 | 9/2007 | Izumida |
| 2007/0235819 A1 | 10/2007 | Yagishita |
| 2008/0050897 A1 | 2/2008 | Kottantharayil |
| 2008/0179683 A1 | 7/2008 | Sasaki et al. |
| 2009/0181526 A1 | 7/2009 | Okumura et al. |
| 2009/0233383 A1 | 9/2009 | Okumura et al. |
| 2011/0033989 A1 | 2/2011 | Choi et al. |
| 2011/0037141 A1 | 2/2011 | Kim et al. |

FOREIGN PATENT DOCUMENTS

| | | |
|---|---|---|
| JP | 2006-196821 | 7/2006 |
| WO | WO 2006/064772 A1 | 6/2006 |
| WO | WO 2006/098109 A1 | 9/2006 |
| WO | WO 2006/106872 A1 | 10/2006 |

OTHER PUBLICATIONS

Lenoble, D., et al., "Enhanced performance of PMOS MUGFET via integration of conformal plasma-doped source/drain extensions", Symposium on VLSI Technology Digest of Technical Papers, 2006, p. 212, IEEE.

United States Notice of Allowance issued in U.S. Appl. No. 12/512,617, mailed Apr. 18, 2011.

United States Notice of Allowance issued in U.S. Appl. No. 12/512,617 dated Apr. 18, 2011.

* cited by examiner

SEMICONDUCTOR DEVICE AND METHOD FOR PRODUCING THE SAME

CROSS REFERENCE TO RELATED APPLICATIONS

This is a continuation of Application PCT/JP2008/000303, filed on Feb. 22, 2008. This Non-provisional application claims priority under 35 U.S.C. §119(a) on Patent Application No. 2007-195860 filed in Japan on Jul. 27, 2007, the entire contents of which are hereby incorporated by reference.

TECHNICAL FIELD

The present invention relates to a semiconductor device and a method for producing the same, and more particularly to a semiconductor device of a three-dimensional structure including fin-shaped semiconductor regions on a substrate and a method for producing the same.

BACKGROUND ART

In recent years, demands for miniaturizing semiconductor devices have been increasing along with the increase in the degree of integration, functionality and speed thereof. In view of this, various device structures have been proposed in the art, aiming at the reduction in the area of the substrate taken up by transistors. Among others, attention has been drawn to field effect transistors having a fin-shaped structure. A field effect transistors having the fin-shaped structure is commonly called a fin-shaped FET (field effect transistor), and has an active region consisting of thin wall (fin)-like semiconductor regions perpendicular to the principle plane of the substrate. In a fin-shaped FET, the side surface of the semiconductor region can be used as a channel surface, whereby it is possible to reduce the area on the substrate taken up by the transistor (see, for example, Patent Document 1 and Non-Patent Document 1).

FIGS. 17A-D show a structure of a conventional fin-shaped FET, wherein FIG. 17A is a plan view, FIG. 17B is a cross-sectional view taken along line A-A in FIG. 17A, FIG. 17C is a cross-sectional view taken along line B-B in FIG. 17A, and FIG. 17D is a cross-sectional view taken along line C-C in FIG. 17A.

As shown in FIGS. 17A-D, a conventional fin-shaped FET includes a supporting substrate 101 made of silicon, an insulating layer 102 made of silicon oxide formed on the supporting substrate 101, semiconductor regions 103a to 103d each formed into a fin shape on the insulating layer 102 (hereinafter referred to as the "fin-shaped semiconductor regions"), a gate electrode 105 formed on the fin-shaped semiconductor regions 103a to 103d with gate insulating films 104a to 104d interposed therebetween, insulative sidewall spacers 106 formed on side surfaces of the gate electrode 105, extension regions 107 formed on opposing regions of the fin-shaped semiconductor regions 103a to 103d sandwiching the gate electrode 105 therebetween, and source-drain regions 117 formed on opposing regions of the fin-shaped semiconductor regions 103a to 103d sandwiching the gate electrode 105 and the insulative sidewall spacer 106 therebetween. The fin-shaped semiconductor regions 103a to 103d are placed on the insulating layer 102 so as to be arranged at regular intervals in the gate width direction. The gate electrode 105 is formed so as to extend across the fin-shaped semiconductor regions 103a to 103d in the gate width direction. The extension region 107 includes a first impurity region 107a formed in an upper portion of each of the fin-shaped semiconductor regions 103a to 103d, and a second impurity region 107b formed in a side portion of each of the fin-shaped semiconductor regions 103a to 103d. The source-drain region 117 includes a third impurity region 117a formed in an upper portion of each of the fin-shaped semiconductor regions 103a to 103d, and a fourth impurity region 117b formed in a side portion of each of the fin-shaped semiconductor regions 103a to 103d. Note that pocket regions are not described herein or shown in the figure.

FIGS. 18A-D are cross-sectional views showing step by step a conventional method for producing a semiconductor device. Note that FIGS. 18A-D correspond to the cross-sectional structure taken along line C-C in FIG. 17A. In FIGS. 18A-D, like elements to those shown in FIGS. 17A-D are denoted by like reference numerals and will not be described redundantly.

First, as shown in FIG. 18A, there is provided an SOI (silicon on insulator) substrate, in which the insulating layer 102 made of silicon oxide is provided on the supporting substrate 101 made of silicon, and a semiconductor layer made of silicon is provided on the insulating layer 102. Then, the semiconductor layer is patterned to form the fin-shaped semiconductor region 103b to be the active region.

Then, as shown in FIG. 18B, the gate insulating film 104 is formed on the surface of the fin-shaped semiconductor region 103b, after which a polysilicon film 105A is formed across the entire surface of the supporting substrate 101.

Then, as shown in FIG. 18C, the polysilicon film 105A and the gate insulating film 104 are etched successively to form the gate electrode 105 on the fin-shaped semiconductor region 103b with the gate insulating film 104b interposed therebetween. Then, using the gate electrode 105 as a mask, the semiconductor region 103b is ion-implanted with an impurity to form the extension region 107 and the pocket region (not shown).

Next, as shown in FIG. 18D, an insulating film is formed across the entire surface of the supporting substrate 101, and then the insulating film is etched back by using anisotropic dry etching to thereby form the insulative sidewall spacer 106 on the side surface of the gate electrode 105. Then, using the gate electrode 105 and the side wall 106 as a mask, the semiconductor region 103b is ion-implanted with an impurity to form the source-drain region 117.

Through the steps described above, it is possible to obtain a fin-shaped MISFET (metal insulator semiconductor field effect transistor) having the gate electrode 105 formed on the fin-shaped semiconductor region 103b with the gate insulating film 104b interposed therebetween.

In recent years, it has been drawing attention to use a plasma doping method in order to conformally dope the upper surface and the side surface of a fin-shaped semiconductor region. For example, a pulsed DC plasma technique has been proposed in the art (Non-Patent Document 1) as a plasma doping method used for conformal doping. This is a method in which a plasma is generated on and off, and has an advantage in that etching is unlikely to occur. However, if the method is used for doping a fin-shaped semiconductor region, the specific resistance of the side surface of the semiconductor region will be larger than that of the upper surface of the semiconductor region.

Note that in addition to the pulsed DC plasma technique of Non-Patent Document 1, plasma doping methods include a method disclosed in Patent Document 2 as a representative method. Patent Document 2 proposes a technique using an inductively coupled plasma (ICP) method. This is a method desirably capable of uniformly doping into the surface of a large substrate such as a wafer having a diameter of 300 mm, for example, by employing a longer time region (doping time) than that used in a pulsed DC plasma method.

Patent Document 3 discloses a plasma doping method for conformally doping the trench side surface. Note however that this is a technique for doping only the trench side surface, and it is not an object of the technique to dope the upper surface and the side surface of a fin-shaped semiconductor region. Specifically, with a method doping only the side surface as disclosed in Patent Document 3, doping is performed while masking the upper surface, thus failing to realize effects of the present invention to be described later, such as the realization of conformal doping on the upper surface and the side surface, and the prevention of chipping of the upper corner of a fin-shaped semiconductor region.

Patent Document 1 Japanese Laid-Open Patent Publication No. 2006-196821

Patent Document 2 International Publication WO2006/064772

Patent Document 3 Japanese Laid-Open Patent Publication No. 1-295416

Non-Patent Document 1 D. Lenoble, et al., Enhanced performance of PMOS MUGFET via integration of conformal plasma-doped source/drain extensions, 2006 Symposium on VLSI Technology Digest of Technical Papers, p. 212

DISCLOSURE OF THE INVENTION

Problems to be Solved by the Invention

However, with conventional methods for producing a semiconductor device disclosed in documents such as Patent Document 1 and Non-Patent Document 1 identified above, it is not possible to obtain desirable transistor characteristics.

In view of this, it is an object of the present invention to realize a semiconductor device including fin-shaped semiconductor regions with which desirable characteristics can be obtained (for example, a device in which a substantial decrease in drain current is caused).

Means for Solving the Problems

In order to achieve the object set forth above, the present inventors have studied the reason why desirable transistor characteristics cannot be obtained with a conventional method for producing a fin-shaped FET, leading to the following findings.

FIG. 19A is a cross-sectional view showing the step of forming an extension region of a fin-shaped FET as described in Patent Document 1, and FIG. 19B is a cross-sectional view showing the step of forming an extension region of a fin-shaped FET as described in Non-Patent Document 1. Note that FIGS. 19A and B correspond to the cross-sectional structure taken along line B-B in FIG. 17A. In FIGS. 19A and B, like elements to those shown in FIGS. 17A-D are denoted by like reference numerals and will not be described redundantly.

As shown in FIG. 19A, in the method disclosed in Patent Document 1, in order to introduce an impurity not only into the upper surface of the fin-shaped semiconductor regions 103a to 103d but also into the side surface thereof, ions 108a and 108b are implanted by ion implantation into the fin-shaped semiconductor regions 103a to 103d at respective implantation angles inclined with respect to the vertical direction in different directions from each other, thus forming the extension region 107. In such a case, the first impurity region 107a, into which the ions 108a and the ions 108b are both implanted, is formed in the upper portion of the fin-shaped semiconductor regions 103a to 103d. However, the second impurity region 107b, into which either the ions 108a or the ions 108b are implanted, is formed in each side portion of the fin-shaped semiconductor regions 103a to 103d. Thus, where the dose of the ions 108a and that of the ions 108b are equal to each other, the implantation dose of a first impurity region 107a is twice as large as the implantation dose of the second impurity region 107b.

As shown in FIG. 19B, in the method disclosed in Non-Patent Document 1, the extension region 107 is formed in the fin-shaped semiconductor regions 103a to 103d by using a plasma doping method. Where an impurity is implanted by using a plasma doping method, the first impurity region 107a is formed in an upper portion of the fin-shaped semiconductor regions 103a to 103d, wherein the implantation dose of the first impurity region 107a is determined by the balance between implanted ions 109a, an adsorbed species (a neutral species such as gas molecules or radicals) 109b, and an impurity 109c that is desorbed from the fin-shaped semiconductor regions 103a to 103d by sputtering. However, the implantation dose of each side portion of the fin-shaped semiconductor regions 103a to 103d is less influenced by the implanted ions 109a and the impurity 109c desorbed by sputtering, and there is formed a second impurity region 107b whose implantation dose is mainly determined by the adsorbed species 109b. As a result, the implantation dose of the first impurity region 107a is higher than that of the second impurity region 107b by about 25%, for example, whereby the sheet resistance of the first impurity region 107a is lower than that of the second impurity region 107b by about 25%, for example.

The application of the plasma doping method disclosed in Patent Document 2 in order to form an impurity region in a fin-shaped semiconductor region has the following problem. Where the plasma doping method disclosed in Patent Document 2 (the plasma-generating gas is $B_2H_6$/He) is applied to a flat semiconductor region 151, as shown in FIG. 20A, the amount of chipping of silicon of the semiconductor region 151 is less than or equal to 1 nm/min. However, where an impurity region is formed in a fin-shaped semiconductor region by using the plasma doping method disclosed in Patent Document 2, as shown in FIG. 20B, the amount of chipping of the upper corner of a fin-shaped semiconductor region 152 on the flat semiconductor region 151 is greater than 10 nm/min. FIG. 21 is a perspective view showing a gate electrode formed on a fin-shaped semiconductor region having such a problem with a gate insulating film interposed therebetween. As shown in FIG. 21, a gate electrode 163 is formed so as to bridge over a fin-shaped semiconductor region 161 having an impurity region 161a in an upper portion thereof and an impurity region 161b in a side portion thereof, with a gate insulating film 162 interposed therebetween. Herein, a, b, c and d denote corners on the source side along the inner wall of the gate insulating film 162 having a pommel horse shape, and a", b", c" and d" are obtained by translating the corners a, b, c and d to the source-side end surface of the fin-shaped semiconductor region 161. Specifically, the amount of chipping G of the upper corner of the fin-shaped semiconductor region 161 is the distance from the upper corner to b" or c", and assuming that the radius of curvature of the upper corner is r, $G=(\sqrt{2}-1)\cdot r$ holds (where the radius of curvature r' of the upper corner before doping is 0). If the amount of chipping G of the upper corner of the fin-shaped semiconductor region 161 increases, there will be an unintended gap between the inner wall corner b or c of the gate insulating film 162 and the impurity region 161a or 161b to be the extension region, for example.

As described above, with a conventional method for forming an extension region of a fin-shaped FET (see FIG. 17, FIG. 18), the implantation dose of the first impurity region 107a formed in an upper portion of the fin-shaped semiconductor regions 103a to 103d is higher than that of the second impurity region 107b formed in a side portion of the fin-shaped semiconductor regions 103a to 103d. Moreover, the junction depth of the second impurity region 107b is shallower than that of the first impurity region 107a. Accordingly, the sheet resistance, the specific resistance, or the spreading resistance of the first impurity region 107a becomes lower than that of the second impurity region 107b. It is noted that Rs=ρ/t is satisfied where Rs is a sheet resistance of a target, ρ is a specific resistance (resistivity), t is a thickness (junction depth), and ρw is a spreading resistance. Further, as expressed in the relational expression ρw=CF×k×ρ/2πr, which is widely known as the spreading resistance measurement, the resistivity (specific resistance) ρ and the spreading resistance ρw are in principal in a one-to-one relationship to lead to establishment of a proportional relationship between Rs and ρw/t. In the aforementioned relational expression, CF is a correction term taking the volume effect of the spreading resistance ρw taken into consideration (CF=1 where the correction term is absent), k is a correction term taking the polarity dependence of the Schottky barrier between a probe and a sample into consideration (k=1 where the sample is p-type silicon and k=1 to 3 where the sample is n-type silicon, for example), and r is a radius of curvature of the tip end of the probe.

When a fin-shaped FET having such an extension structure is operated, the current flowing through the extension region 107 is localized in the first impurity region 107a where the implantation dose is higher, i.e., the sheet resistance is lower, than the second impurity region 107b, thereby failing to obtain desirable transistor characteristics.

Moreover, in the conventional fin-shaped FET (see FIG. 17, FIG. 18), the source-drain region is also formed by using an ion implantation method or a plasma doping method similar to that for the extension region. Therefore, also in the source-drain region 117, the implantation dose of the third impurity region 117a formed in an upper portion of the fin-shaped semiconductor regions 103a to 103d is higher than that of the fourth impurity region 117b formed in a side portion of the fin-shaped semiconductor regions 103a to 103d. Moreover, the junction depth of the fourth impurity region 117b is shallower than that of the third impurity region 117a. When a fin-shaped FET having such a source-drain structure is operated, the current flowing through the source-drain region 117 is localized in the second impurity region 117a where the implantation dose is higher, i.e., the sheet resistance is lower, than the fourth impurity region 117b, thereby failing to obtain desirable transistor characteristics.

With the conventional method for forming an extension region of a fin-shaped FET (see FIG. 21), there will be an unintended gap between the inner wall of the gate insulating film 162 bridging over the fin-shaped semiconductor region 161 and the extension region of the fin-shaped semiconductor region 161. When a fin-shaped FET having such an extension structure is operated, the current flowing through the extension region is less likely to flow through the upper corner of the fin-shaped semiconductor region 161, thereby failing to obtain desirable transistor characteristics.

Based on the above findings, the present inventors have invented a method for realizing a semiconductor device including an impurity region in a side portion of a fin-shaped semiconductor region where the implantation dose is greater than or equal to 80% of that in an upper portion of the fin-shaped semiconductor region, by setting the pressure during plasma doping to be less than or equal to 0.6 Pa, and more preferably less than or equal to 0.5 Pa. Particularly, in some cases with a fin-shaped FET, the width of the impurity region formed in a side portion of the fin-shaped semiconductor region accounts for 70% or more of the width of the extension region and the source-drain region in the gate width direction. Therefore, it has become important that the implantation dose of the impurity region formed in a side portion of the fin-shaped semiconductor region is made substantially equal to or greater than that of the impurity region formed in an upper portion of the fin-shaped semiconductor region as much as possible. In other words, it has become important to set the specific resistance, the spreading resistance, or the sheet resistance of the impurity region formed in a side portion of the fin-shaped semiconductor region to be less than or equal to 1.25 times that of the impurity region formed in an upper portion of the fin-shaped semiconductor region.

Note that while the lower limit of the pressure during plasma doping can be set to be low within such a range that does not present problems with respect to the throughput, the limitations of the apparatus, etc., the lower limit is about 0.1 Pa in view of the performance of a state-of-the-art ICP plasma apparatus, etc., and is about 0.01 Pa in view of the performance of a plasma apparatus to be used in the future.

Specifically, a first semiconductor device of the present invention includes: a first semiconductor region formed on a substrate and having an upper surface and a side surface; a first impurity region of a first conductivity type formed in an upper portion of the first semiconductor region; a second impurity region of a first conductivity type formed in a side portion of the first semiconductor region; and a gate insulating film formed so as to cover at least a side surface and an upper corner of a predetermined portion of the first semiconductor region, wherein a radius of curvature r' of an upper corner of a portion of the first semiconductor region located outside the gate insulating film is greater than a radius of curvature r of an upper corner of a portion of the first semiconductor region located under the gate insulating film and is less than or equal to 2r.

In the first semiconductor device of the present invention, the transistor characteristics can be significantly improved over the conventional techniques, if the implantation dose of the second impurity region formed in the side portion of the first semiconductor region having an upper surface and a side surface, i.e., the fin-shaped semiconductor region, is about 80% (more preferably 90%) or more of that of the first impurity region formed in the upper portion of the fin-shaped semiconductor region, in other words, if the sheet resistance, the specific resistance, or the spreading resistance of the second impurity region is less than or equal to 1.25 times (more preferably, less than or equal to 1.1 times) that of the first impurity region.

If "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics even if the implantation dose of the second impurity region is somewhat smaller than that of the first impurity region. An increase in the aspect ratio accordingly increases the necessity to make the implantation dose of the second impurity region to be 80% or more of that of the first impurity region.

In order to make the gap between the impurity region provided in the first semiconductor region and the inner wall of the gate insulating film to be completely zero, the amount of etching of the first semiconductor region by using a plasma doping needs to be made completely zero. Then, it is necessary to use conditions with very small ion densities, which makes the amount of time required for the plasma doping process to be very long, thereby significantly lowering the productivity. Therefore, if the gap between the impurity region provided in the first semiconductor region and the inner wall of the gate insulating film is greater than zero and less than or equal to about 10 nanometers; in other words, if the radius of curvature r' of the upper corner of a portion of first semiconductor region located outside the gate insulating film is greater than the radius of curvature r of the upper corner of a portion of the first semiconductor region located under the gate insulating film and is less than or equal to 2r, it is possible to ensure the productivity of the plasma doping process while suppressing the degradation in the transistor characteristics.

In the first semiconductor device of the present invention, the junction depth of the second impurity region may be substantially equal to or greater than that of the first impurity region.

In the first semiconductor device of the present invention, the first semiconductor region may have a fin shape.

In the first semiconductor device of the present invention, the first semiconductor region may be formed on an insulating layer formed on the substrate.

If the first semiconductor device of the present invention further includes a gate electrode formed on the gate insulating film, wherein the first impurity region and the second impurity region are formed in another portion of the first semiconductor region other than the predetermined portion, it is possible to form a fin-shaped FET. In such a case, the gate insulating film may be formed also on an upper surface of the first semiconductor region in the predetermined portion of the first semiconductor region. The first impurity region and the second impurity region may be a P-type extension region. Moreover, the semiconductor device may further include: an insulative sidewall spacer formed on a side surface of the gate electrode; a third impurity region of a first conductivity type formed in an upper portion of the first semiconductor region; and a fourth impurity region of a first conductivity type formed in a side portion of the first semiconductor region, wherein: the sheet resistance (or the specific resistance or the spreading resistance) of the fourth impurity region is less than or equal to 1.25 times that of the third impurity region; and the third impurity region and the fourth impurity region are formed in a portion of the first semiconductor region which is located outside the insulative sidewall spacer and is provided in the other portion of the first semiconductor region. Herein, the third impurity region and the fourth impurity region may be a P-type source-drain region.

Where the first semiconductor device of the present invention further includes a gate electrode formed on the gate insulating film, wherein the first impurity region and the second impurity region are formed in another portion of the first semiconductor region other than the predetermined portion, the semiconductor device may further include an insulative sidewall spacer formed on a side surface of the gate electrode, wherein the first impurity region and the second impurity region are formed in a portion of the first semiconductor region which is located outside the insulative sidewall spacer and is provided in the other portion of the first semiconductor region. Herein, the first impurity region and the second impurity region may be a P-type source-drain region.

Where the first semiconductor device of the present invention further includes a gate electrode formed on the gate insulating film, wherein the first impurity region and the second impurity region are formed in another portion of the first semiconductor region other than the predetermined portion, if a height of the side surface of the first semiconductor region is greater than a width of the upper surface of the first semiconductor region in a gate width direction, the effects of the present invention are pronounced.

A second semiconductor device of the present invention includes: a plurality of semiconductor regions formed on a substrate and each having an upper surface and a side surface; a first impurity region of a first conductivity type formed in an upper portion of each of the plurality of semiconductor regions; a second impurity region of a first conductivity type formed in a side portion of each of the plurality of semiconductor regions; and a plurality of gate insulating films formed so as to cover at least a side surface and an upper corner of a predetermined portion of the plurality of semiconductor regions, wherein a radius of curvature r' of each upper corner of portions of the plurality of semiconductor regions located outside the plurality of gate insulating films is greater than a radius of curvature r of each upper corner of portions of the plurality of semiconductor regions located under the plurality of gate insulating films and is less than or equal to 2r.

In the second semiconductor device of the present invention, the transistor characteristics can be significantly improved over the conventional techniques, if the implantation dose of the second impurity region formed in the side portion of the plurality of semiconductor regions having an upper surface and a side surface, i.e., the fin-shaped semiconductor regions, is about 80% (more preferably 90%) or more of that of the first impurity region formed in the upper portion of the fin-shaped semiconductor regions, in other words, if the sheet resistance, the specific resistance, or the spearing resistance of the second impurity region is less than or equal to 1.25 times (more preferably, less than or equal to 1.1 times) that of the first impurity region.

If the second semiconductor device of the present invention further includes a gate electrode formed on each of the plurality of semiconductor regions with a gate insulating film interposed therebetween, wherein the gate electrode extends across the plurality of semiconductor regions in a gate width direction, it is possible to form a fin-shaped FET. Then, the first impurity region and the second impurity region may be a P-type extension region or a P-type source-drain region.

The second semiconductor device of the present invention may further include a third semiconductor region connecting together end portions of the plurality of semiconductor regions on each side of the semiconductor regions in a gate length direction.

A method for producing a semiconductor device of the present invention is a method for producing the first or second semiconductor device of the present invention as set forth above, including: a step (a) of forming on a substrate a first semiconductor region having an upper surface and a side surface; and a step (b) of implanting the first semiconductor region with an impurity of a first conductivity type by a plasma doping method to thereby form a first impurity region in an upper portion of the first semiconductor region and a second impurity region in a side portion of the first semiconductor region, wherein in the step (b), a pressure during plasma doping is set to be less than or equal to 0.6 Pa.

Thus, the method for producing a semiconductor device of the present invention is characterized in the control of the amount of etching and the implantation dose for the fin-shaped semiconductor region using a plasma doping method, whereby it is possible to control the amount of etching by adjusting the pressure during plasma doping and it is possible to control the sheet resistance to a desirable value through the control of the implantation dose by annealing after doping.

Specifically, in plasma doping, as a material gas is supplied into a plasma, there will be radicals, ions or constituent molecules of the material gas or molecules or atoms resulting from the decomposition of the molecules in the plasma. The present invention focuses on the following inherent properties (1)-(3) of the ions, gas molecules, radicals, etc.:

(1) ions in a plasma are basically incident on the substrate vertically with respect to the principle plane of the substrate;

(2) neutral species such as gas molecules, radicals, etc., in a plasma are incident on the substrate in random directions with respect to the principle plane of the substrate; and (3) an impurity introduced into a semiconductor, whether it is introduced in the form of ions or neutral species, contributes to electrical conduction.

In addition to the properties (1)-(3), the present inventors have newly found in an experiment the following property characteristic of plasma doping on a fin-shaped semiconductor region:

(4) the factor that etches the corner portion (the upper corner) of a fin-shaped semiconductor region is basically the ions in the plasma, and the amount of etching of the corner portion is suppressed by reducing the ion density.

The present invention is a method for applying this to a three-dimensional device such as a fin-shaped FET, and a primary characteristic of the present invention is that "the pressure during plasma doping is set to be less than or equal to 0.6 Pa". Thus, by sufficiently decreasing the pressure during plasma doping, the ion density decreases to a very low level, thereby suppressing the amount of etching of the corner portion of the fin-shaped semiconductor region. At the same time, it is possible to reduce the amount of impurity incident upon the principle plane of the substrate in a perpendicular direction, and to relatively increase the amount of impurity incident upon the principle plane of the substrate in random directions. Moreover, for the decrease in the implantation dose due to the decrease in the ion density, it is possible to compensate for the decrease in the implantation dose to thereby achieve a desirable implantation dose by increasing the proportion of an impurity-containing gas in the material gas with respect to the diluent gas. Therefore, it is possible to obtain a semiconductor device in which an impurity region in a side portion of the semiconductor region has an implantation dose of 80% or more of that in an upper portion of the semiconductor region. Therefore, it is possible to obtain desirable transistor characteristics even if the proportion of the width of the impurity region formed in the side portion of the fin-shaped semiconductor region increases with respect to the width in the gate width direction of the extension region and the source-drain region of a fin-shaped FET, for example.

In the method for producing a semiconductor device of the present invention, if the pressure during plasma doping in the step (b) is set to be greater than or equal to 0.1 Pa and less than or equal to 0.5 Pa, it is possible to reliably suppress the amount of etching of the corner portion of the fin-shaped semiconductor region without decreasing the throughput of plasma doping.

The method for producing a semiconductor device of the present invention may further include, between the step (a) and the step (b), a step of forming a gate insulating film so as to cover at least a side surface and an upper corner of a predetermined portion of the first semiconductor region, wherein after the step (b), a radius of curvature r' of an upper corner of a portion of the first semiconductor region located outside the gate insulating film is greater than a radius of curvature r of an upper corner of a portion of the first semiconductor region located under the gate insulating film and is less than or equal to 2r.

In the method for producing a semiconductor device of the present invention, in the step (b), an ion current density during plasma doping may be set to be less than or equal to 0.5 mA/cm².

In the method for producing a semiconductor device of the present invention, the transistor characteristics can be significantly improved over the conventional techniques, if the implantation dose of the second impurity region after the step (b) is about 80% (more preferably 90%) or more of that of the first impurity region formed in the upper portion of the fin-shaped semiconductor regions, in other words, if the sheet resistance (or the specific resistance or the spreading resistance) of the second impurity region after the step (b) is less than or equal to 1.25 times (more preferably less than or equal to 1.1 times) that of the first impurity region.

The method for producing a semiconductor device of the present invention may further include, before the step (a), a step of forming an insulating layer on the substrate, wherein the first semiconductor region is formed on the insulating layer in the step (a).

In the method for producing a semiconductor device of the present invention, the side surface of the first semiconductor region may be a surface perpendicular to the upper surface of the first semiconductor region.

In the method for producing a semiconductor device of the present invention, the step (b) may be performed by using a plasma generated from a gas containing the impurity; and the gas containing the impurity may contain molecules $B_mH_n$ (m and n are natural numbers) composed of boron atoms and hydrogen atoms.

In the method for producing a semiconductor device of the present invention, the step (b) may be performed by using a plasma generated from a gas containing the impurity; and the gas containing the impurity may be a gas obtained by diluting molecules including boron atoms with a rare gas.

In the method for producing a semiconductor device of the present invention, the step (b) may be performed by using a plasma generated from a gas containing the impurity; and a gas containing the impurity may be a gas obtained by diluting molecules including the impurity with helium.

In the method for producing a semiconductor device of the present invention, the step (b) may be performed by using a plasma generated from a gas containing the impurity; and the gas containing the impurity may be a mixed gas of $B_2H_6$ and He. In such a case, it is preferred that the concentration by mass of $B_2H_6$ in the mixed gas is greater than or equal to 0.01% and less than or equal to 1% so that it is easy to introduce boron into silicon. A sufficient amount of boron is unlikely to be introduced with the $B_2H_6$ gas concentration being less than or equal to 0.01%, and a boron-containing deposit is likely to deposit on the surface of the semiconductor substrate with the $B_2H_6$ gas concentration being greater than or equal to 1%.

In the method for producing a semiconductor device of the present invention, the step (b) may be performed by using a plasma generated from a gas containing the impurity; and the gas containing the impurity may contain $BF_3$. While F is an element that easily combines with silicon, H similarly easily combines with silicon. $B_2H_6$ and $BF_3$ include, for each B atom, three F or H atoms, which easily combine with silicon. Since the proportion of F with respect to B and that of H are both 1:3, the use of $BF_3$ is expected to provide similar effects to those obtained when using $B_2H_6$.

In the method for producing a semiconductor device of the present invention, the step (b) may be performed by using a plasma generated from a gas containing the impurity; and the gas containing the impurity may contain As or P. Since As and P do not easily combine with silicon, the use of a gas containing As or P provides the effect of particularly suppressing the amount of etching of the corner portion of the fin-shaped semiconductor region, as with a gas such as $B_2H_6$ containing B, which similarly do not easily combine with silicon. Specifically, the gas containing As or P may be a gas containing $AsH_3$ or $PH_3$.

Another method for producing a semiconductor device of the present invention includes a step of implanting a semiconductor region with an impurity of a first conductivity type by a plasma doping method to form an impurity region in the semiconductor region, wherein in the step of forming the impurity region, a pressure during plasma doping is set to be less than or equal to 0.6 Pa.

With the other method for producing a semiconductor device of the present invention, it is possible to suppress the amount of etching by adjusting the pressure during plasma doping and it is possible to control the sheet resistance to a desirable value through the control of the implantation dose by annealing after doping.

Effects of the Invention

According to the present invention, it is possible to obtain a semiconductor device including an impurity region in a side portion of a fin-shaped semiconductor region, the impurity region having an implantation dose substantially equal to or greater than that in an upper portion of the fin-shaped semiconductor region. In other words, it is possible to obtain a semiconductor device including an impurity region having a low sheet resistance in a side portion of the fin-shaped semiconductor region. Therefore, it is possible to prevent the degradation in the characteristics of a three-dimensional device such as a fin-shaped FET.

BRIEF DESCRIPTION OF THE DRAWINGS

FIGS. 1A-D show a structure of a semiconductor device according to a first embodiment of the present invention, wherein FIG. 1A is a plan view, FIG. 1B is a cross-sectional view taken along line A-A in FIG. 1A, FIG. 1C is a cross-sectional view taken along line B-B in FIG. 1A, and FIG. 1D is a cross-sectional view taken along line C-C in FIG. 1A.

FIGS. 15A-C show cross-sectional structures of the semiconductor device according to a second variation of the first embodiment of the present invention, wherein FIG. 15A is a cross-sectional view taken along line A-A in FIG. 1A, FIG. 15B is a cross-sectional view taken along line B-B in FIG. 1A, and FIG. 15C is a cross-sectional view taken along line C-C in FIG. 1A.

FIGS. 17A-D show a structure of a conventional fin-shaped FET, wherein FIG. 17A is a plan view, FIG. 17B is a cross-sectional view taken along line A-A in FIG. 17A, FIG. 17C is a cross-sectional view taken along line B-B in FIG. 17A, and FIG. 17D is a cross-sectional view taken along line C-C in FIG. 17A.

DETAILED DESCRIPTION OF THE INVENTION

First Embodiment

The structure of a semiconductor device according to a first embodiment of the present invention will now be described with reference to the drawings.

Figure 1A:
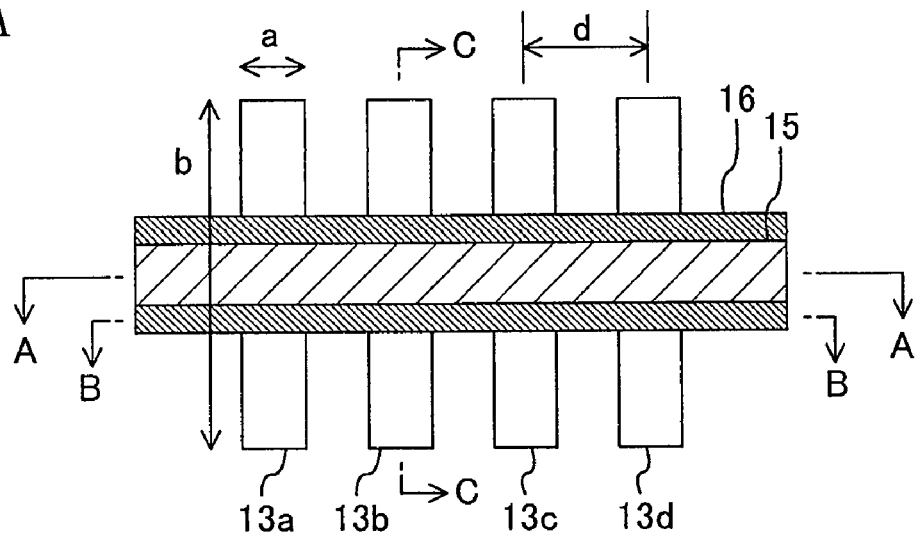
Figure 1B:
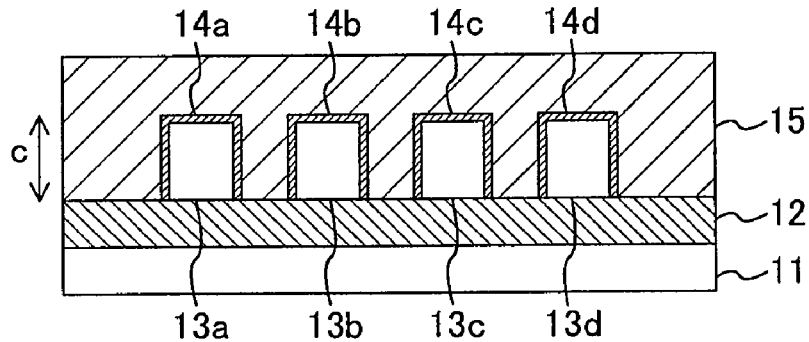
Figure 1C:
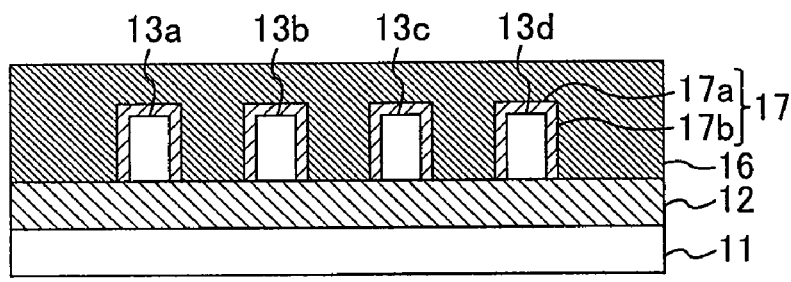
Figure 1D:
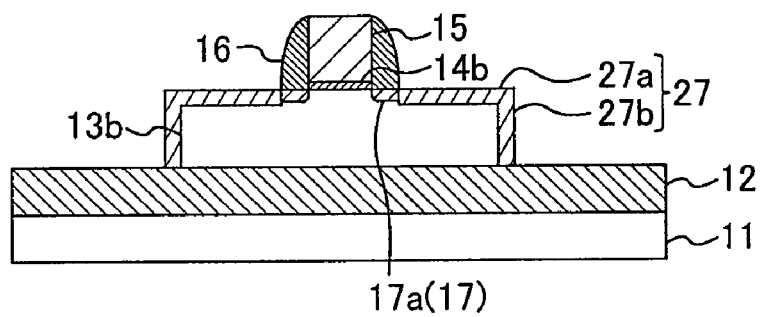

FIGS. 1A-D show a structure of a semiconductor device according to the first embodiment of the present invention, i.e., a semiconductor device including a fin-shaped FET, wherein FIG. 1A is a plan view, FIG. 1B is a cross-sectional view taken along line A-A in FIG. 1A, FIG. 1C is a cross-sectional view taken along line B-B in FIG. 1A, and FIG. 1D is a cross-sectional view taken along line C-C in FIG. 1A.

As shown in FIGS. 1A-D, the fin-shaped FET of the present embodiment includes a supporting substrate 11 made of silicon, for example, an insulating layer 12 made of silicon oxide, for example, formed on the supporting substrate 11, fin-shaped semiconductor regions 13a to 13d formed on the insulating layer 12, a gate electrode 15 formed on the fin-shaped semiconductor regions 13a to 13d with gate insulating films 14a to 14d made of a silicon oxynitride film, for example, interposed therebetween, insulative sidewall spacers 16 formed on the side surfaces of the gate electrode 15, extension regions 17 formed in opposing regions of the fin-shaped semiconductor regions 13a to 13d that are opposing each other with the gate electrode 15 interposed therebetween, and source-drain regions 27 formed in opposing regions of the fin-shaped semiconductor regions 13a to 13d that are opposing each other with the gate electrode 15 and the insulative sidewall spacers 16 interposed therebetween. The fin-shaped semiconductor regions 13a to 13d each have a width a in the gate width direction of about 30 nm, for example, a width b in the gate length direction of about 200 nm, for example, and a height (thickness) c of about 50 nm, for example, and are arranged with a pitch d (about 60 nm, for example) in the gate width direction on the insulating layer 12. The upper surface and the side surface of the fin-shaped semiconductor regions 13a to 13d may or may not be perpendicular to each other. The gate electrode 15 is formed so as to extend across the fin-shaped semiconductor regions 13a to 13d in the gate width direction. The extension region 17 includes a first impurity region 17a formed in an upper portion of each of the fin-shaped semiconductor regions 13a to 13d, and a second impurity region 17b formed in a side portion of each of the fin-shaped semiconductor regions 13a to 13d. The source-drain region 27 includes a third impurity region 27a formed in an upper portion of each of the fin-shaped semiconductor regions 13a to 13d, and a fourth impurity region 27b formed in a side portion of each of the fin-shaped semiconductor regions 13a to 13d. Note that pocket regions are not described herein or shown in the figure.

The present embodiment is characteristic in that the implantation dose of the second impurity region 17b formed in the side portion of the fin-shaped semiconductor region is set to be 80% or more of that of the first impurity region 17a formed in the upper portion of the fin-shaped semiconductor region. Thus, the sheet resistance of the second impurity region 17b of the extension region 17 can be set to be less than or equal to 1.25 times that of the first impurity region 17a, whereby it is possible to obtain desirable transistor characteristics even if the proportion of the width of the second impurity region 17b formed in the side portion of the fin-shaped semiconductor region increases with respect to the width in the gate width direction of the extension region 17. Similarly, the implantation dose of the fourth impurity region 27b formed in the side portion of the fin-shaped semiconductor region is set to be 80% or more of that of the third impurity region 27a formed in the upper portion of the fin-shaped semiconductor region. Thus, the sheet resistance of the fourth impurity region 27b of the source-drain region 27 can be set to be less than or equal to 1.25 times that of the third impurity region 27a, whereby it is possible to obtain desirable transistor characteristics even if the proportion of the width of the fourth impurity region 27b formed in the side portion of the fin-shaped semiconductor region increases with respect to the width in the gate width direction of the source-drain region 27.

Although the sheet resistance of the second impurity region 17b (the fourth impurity region 27b) is set less than or equal to 1.25 times that of the first impurity region 17a (the third impurity region 27a) in the above description, the same effects can be obtained when the specific resistance or the spreading resistance of the second impurity region 17b (the fourth impurity region 27b) is set less than or equal to 1.25 times that of the first impurity region 17a (the third impurity region 27a). Herein, $Rs=\rho/t$ is satisfied where Rs is a sheet resistance of a target, $\rho$ is a specific resistance (resistivity), t is a thickness (junction depth), and $\rho w$ is a spreading resistance. The relationship between the (resistivity) $\rho$ and the spreading resistance $\rho w$ falls in a one-to-one relationship, and accordingly, the proportional relationship between Rs and $\rho w/t$ is established. The following description refers to "the sheet resistance" mainly, but it can be read as "the specific resistance" or "the spreading resistance."

Note that in the present embodiment, if the implantation dose of the second impurity region 17b formed in the side portion of the fin-shaped semiconductor region is about 80% (more preferably 90%) or more of that of the first impurity region 17a formed in the upper portion of the fin-shaped semiconductor region, in other words, if the sheet resistance, the specific resistivity, or the spreading resistance of the second impurity region 17b is less than or equal to 1.25 times (more preferably, less than or equal to 1.1 times) that of the first impurity region 17a, the transistor characteristics can be significantly improved over the conventional techniques. Similarly, if the implantation dose of the fourth impurity region 27b formed in the side portion of the fin-shaped semiconductor region is about 80% (more preferably 90%) or more of that of the third impurity region 27a formed in the upper portion of the fin-shaped semiconductor region, in other words, if the sheet resistance, the specific resistivity, or the spreading resistance of the fourth impurity region 27b is less than or equal to 1.25 times (more preferably, less than or equal to 1.1 times) that of the third impurity region 27a, the transistor characteristics can be significantly improved over the conventional techniques.

Moreover, in the present embodiment, if "the height of the side surface of the fin-shaped semiconductor region"/"the width of the upper surface of the fin-shaped semiconductor region in the gate width direction" (hereinafter referred to as the "aspect ratio") is small, there will be little degradation in the transistor characteristics (e.g., drain current) even if the implantation dose of the second impurity region 17b is somewhat smaller than that of the first impurity region 17a, namely, even if the sheet resistance, the specific resistance, or the spreading resistance of the second impurity region 17b is somewhat greater than that of the first impurity region 17a. An increase in the aspect ratio accordingly increases the necessity to make the implantation dose of the second impurity region 17b to be substantially equal to or greater than that of the first impurity region 17a, namely, the necessity to make the sheet resistance, the specific resistance, or the spreading resistance of the second impurity region 17b to be substantially smaller than or equal to that of the first impurity region 17a. Similarly, if the aspect ratio is small, there will be little degradation in the transistor characteristics even if the implantation dose of the fourth impurity region 27b is somewhat smaller than that of the third impurity region 27a, namely, even if the sheet resistance, the specific resistance, or the spreading resistance of the fourth impurity region 27b is somewhat greater than that of the third impurity region 27a. An increase in the aspect ratio accordingly increases the necessity to make the implantation dose of the fourth impurity region 27b to be substantially smaller than or equal to that of the third impurity region 27a, namely, the necessity to make the sheet resistance, the specific resistance, or the spreading resistance of the fourth impurity region 27b to be substantially smaller than or equal to that of the third impurity region 27a.

The aforementioned transistor characteristics, specifically, the drain current characteristics depend on the implantation dose of the three portions (the upper portion and the side portions) of a fin-shaped semiconductor region. Wherein, in the present embodiment, the drain current can be kept great since the implantation dose of the second impurity region 17b (the fourth impurity region 27b) is comparatively great even if the width of the first impurity region 17a (the third impurity region 27a) located at the upper portion of the fin-shaped semiconductor region is smaller than that of the second impurity region 17b (the fourth impurity region 27b) located at the side portions thereof.

A method for producing a semiconductor device according to the first embodiment of the present invention will now be described with reference to the drawings.

FIGS. 2A-D are cross-sectional views showing step by step the method for producing a semiconductor device of the first embodiment. Note that FIGS. 2A-D correspond to the cross-sectional structure taken along line C-C in FIG. 1A. In FIGS. 2A-D, like elements to those shown in FIGS. 1A-D are denoted by like reference numerals and will not be described redundantly. Needless to say, the values of the thickness, the width, and the like are mere examples in the following description, and the present invention is not limited to any of the values.

Figure 2A:
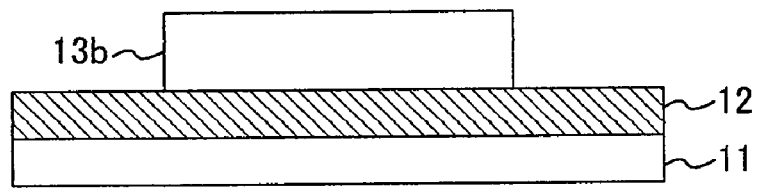
FIGS. 2A-D are cross-sectional views showing step by step the method for producing a semiconductor device according to the first embodiment of the present invention.

First, as shown in FIG. 2A, there is provided an SOI substrate, in which the insulating layer 12 having a thickness of 150 nm and made of silicon oxide, for example, is provided on the supporting substrate 11 having a thickness of 800 μm and made of silicon, for example, and a semiconductor layer having a thickness of 50 nm and made of silicon, for example, is provided on the insulating layer 12. Then, the semiconductor layer is patterned to form the n-type fin-shaped semiconductor region 13b to be the active region. The fin-shaped semiconductor region 13b has a width a in the gate width direction of about 30 nm, for example, a width b in the gate length direction of about 200 nm, for example, and a height (thickness) c of about 50 nm, for example, and is arranged, with other adjacent fin-shaped semiconductor regions, with a pitch d (about 60 nm, for example) in the gate width direction on the insulating layer 12.

Figure 2B:
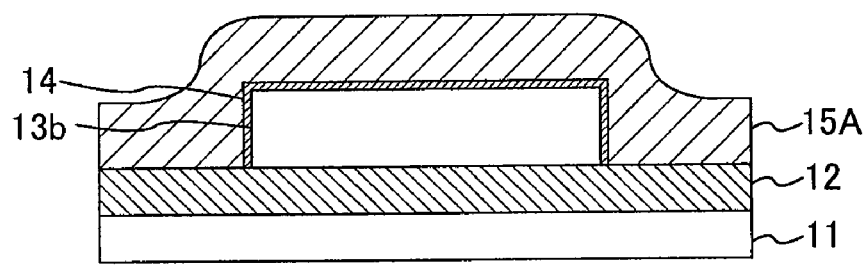

Next, as shown in FIG. 2B, the gate insulating film 14 having a thickness of 3 nm and made of a silicon oxynitride film, for example, is formed on the surface of the fin-shaped semiconductor region 13b, and a polysilicon film 15A having a thickness of 60 nm, for example, is formed across the entire surface of the supporting substrate 11.

Figure 2C:
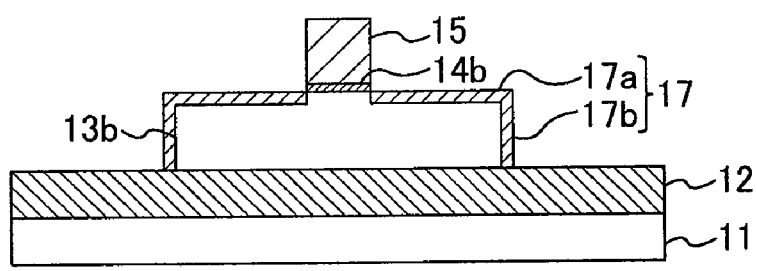

Then, as shown in FIG. 2C, the polysilicon film 15A and the gate insulating film 14 are etched successively to form the gate electrode 15 having a width in the gate length direction of 60 nm, for example, on the fin-shaped semiconductor region 13b with the gate insulating film 14b interposed therebetween. Then, using the gate electrode 15 as a mask, the fin-shaped semiconductor region 13b is doped with a p-type impurity under a plasma doping condition where the pressure during plasma doping is set to be less than or equal to 0.6 Pa. Thus, there is formed a p-type extension region 17 including a p-type first impurity region 17a formed in the upper portion of the fin-shaped semiconductor region 13b and a p-type second impurity region 17b formed in the side portion of the fin-shaped semiconductor region 13b. The formation is done so that the implantation dose of the second impurity region 17b is 80% or more of that of the first impurity region 17a. Thus, the second impurity region 17b is formed to have a sheet resistance, a specific resistance, or a spreading resistance less than or equal to 1.25 times that of the first impurity region 17a. Herein, the plasma doping condition is such that the material gas is $B_2H_6$ (diborane) diluted with He (helium), the $B_2H_6$ concentration in the material gas is 0.5% by mass, the total flow rate of the material gas is 100 $cm^3$/min (standard state), the chamber pressure is 0.35 Pa, the source power (the plasma-generating high-frequency power) is 500 W, the bias voltage (Vpp) is 250 V, the substrate temperature is 30° C., and the plasma doping time is 60 seconds. Then, using the gate electrode 15 as a mask, the fin-shaped semiconductor region 13b is ion-implanted with an impurity to form an n-type pocket region (not shown).

Figure 2D:
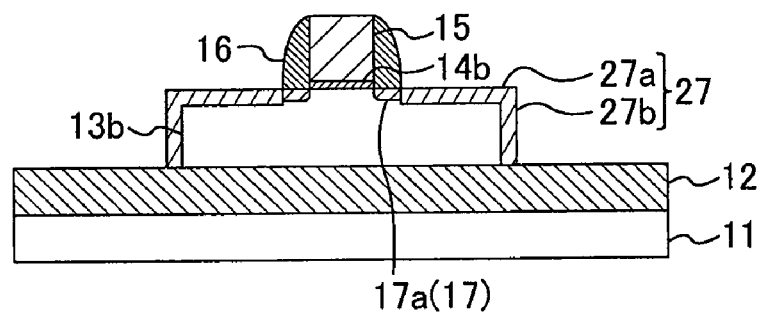

Next, an insulating film having a thickness of 60 nm, for example, is formed across the entire surface of the supporting substrate 11, and then the insulating film is etched back by using anisotropic dry etching to thereby form the insulative sidewall spacer 16 on the side surface of the gate electrode 15, as shown in FIG. 2D. Then, using the gate electrode 15 and the insulative sidewall spacer 16 as a mask, the fin-shaped semiconductor region 13b is doped with a p-type impurity for 60 seconds, for example, under a plasma doping condition where the pressure during plasma doping is set to be less than or equal to 0.6 Pa. Thus, there is formed the p-type source-drain region 27 including the p-type third impurity region 27a formed in the upper portion of the fin-shaped semiconductor region 13b and the p-type fourth impurity region 27b formed in the side portion of the fin-shaped semiconductor region 13b. In this process, the fourth impurity region 27b is formed so that the implantation dose thereof is 80% or more of that of the third impurity region 27a. Thus, the fourth impurity region 27b is formed to have a sheet resistance, a specific resistance, or a spreading resistance less than or equal to 1.25 times that of the third impurity region 27a.

The present embodiment is characteristic in that when the extension region 17 of the fin-shaped FET is formed by using a plasma doping method, the process uses a plasma doping condition where the pressure during plasma doping is set to be less than or equal to 0.6 Pa. Thus, it is possible to obtain a fin-shaped MISFET including the extension region 17 in which the implantation dose of the second impurity region 17b formed in the side portion of the fin-shaped semiconductor region 13b is 80% or more of that of the first impurity region 17a formed in the upper portion of the fin-shaped semiconductor region 13b. Therefore, the sheet resistance, the specific resistance, or the spreading resistance of the second impurity region 17b can be set to be less than or equal to 1.25 times that of the first impurity region 17a, whereby it is possible to obtain desirable transistor characteristics even if the proportion of the width of the second impurity region 17b formed in the side portion of the fin-shaped semiconductor region increases with respect to the width in the gate width direction of the extension region 17. Similarly, when the source-drain region 27 of the fin-shaped FET is formed by using a plasma doping method, the process uses a plasma doping condition where the pressure during plasma doping is set to be less than or equal to 0.6 Pa. Thus, it is possible to obtain a fin-shaped MISFET including the source-drain region 27 in which the implantation dose of the fourth impurity region 27b formed in the side portion of the fin-shaped semiconductor region 13b is 80% or more of that of the third impurity region 27a formed in the upper portion of the fin-shaped semiconductor region 13b. Therefore, the sheet resistance, the specific resistance, or the spreading resistance of the fourth impurity region 27b can be set to be less than or equal to 1.25 times that of the third impurity region 27a, whereby it is possible to obtain desirable transistor characteristics even if the proportion of the width of the fourth impurity region 27b formed in the side portion of the fin-shaped semiconductor region increases with respect to the width in the gate width direction of the source-drain region 27.

In the present embodiment, the n-type fin-shaped semiconductor region 13b is plasma-doped with a p-type impurity to form the p-type extension region 17 and the p-type source-drain region 27, i.e., a p-type MISFET. Alternatively, a p-type fin-shaped semiconductor region may be doped with an n-type impurity to form an n-type extension region and an n-type source-drain region, i.e., an n-type MISFET.

It is understood that in the present embodiment, other parameters such as the gas concentration, the source power or the bias power may be controlled so as to realize a larger implantation dose obtained by the plasma doping shown in FIG. 2C or 2D.

Moreover, in the present embodiment, in order to reduce the sheet resistance of the second impurity region 17b, it is preferred that the junction depth of the second impurity region 17b is set to be substantially equal to or greater than the junction depth of the first impurity region 17a. Such a configuration can be realized by, for example, performing appropriate annealing after performing plasma doping so that the implantation dose of the second impurity region 17b formed in the side portion of the fin-shaped semiconductor region is greater than that of the first impurity region 17a formed in the upper portion of the fin-shaped semiconductor region.

While $B_2H_6$ diluted with He is used as the material gas of plasma doping in the present embodiment, the material gas is not limited to any particular gas as long as the gas contains the impurity to be implanted into the fin-shaped semiconductor regions. Instead of $B_2H_6$, one may employ, for example, other molecules containing boron atoms (e.g., $BF_3$), other molecules composed of boron atoms and hydrogen atoms, or $AsH_3$, $PH_3$, or the like. A gas containing an impurity may or may not be diluted with a rare gas such as He. Note that where $B_2H_6$ diluted with He is used as the material gas of plasma doping as in the present embodiment, it is preferred that the concentration by mass of $B_2H_6$ in the material gas is greater than or equal to 0.01% and less than or equal to 1%. This is preferred because it is then possible to easily introduce boron into silicon. Specifically, a sufficient amount of boron is unlikely to be introduced with the $B_2H_6$ gas concentration being less than or equal to 0.01%, and a boron-containing deposit is likely to deposit on the surface of the semiconductor substrate with the $B_2H_6$ gas concentration being greater than or equal to 1%.

[Mechanism of Present Invention]

The mechanism of the present invention will now be described with reference to FIG. 3.

Figure 3:
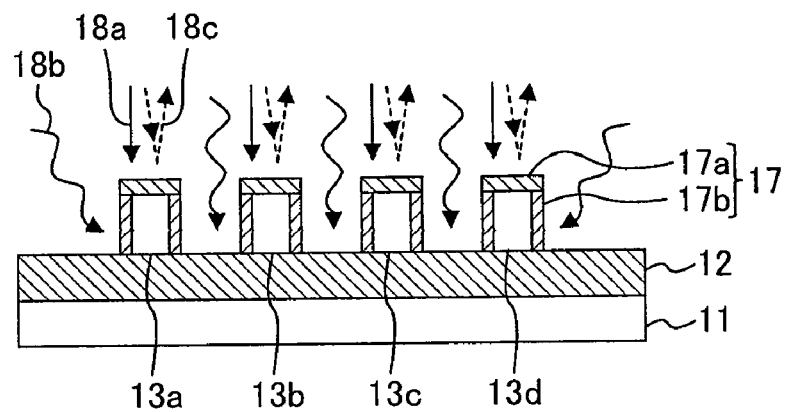
FIG. 3 is a cross-sectional view illustrating a doping method using a plasma doping process of the present invention.

First, as shown in FIG. 3, the fin-shaped semiconductor regions 13a to 13d are implanted with a p-type impurity by using a plasma doping method. Thus, the first impurity region 17a is formed in the upper portion of the fin-shaped semiconductor regions 13a to 13d, wherein the implantation dose of the first impurity region 17a is determined by the balance between implanted ions 18a, an adsorbed species (a neutral species such as gas molecules or radicals) 18b, and an impurity 18c that is desorbed from the fin-shaped semiconductor regions 13a to 13d by sputtering. Moreover, the second impurity region 17b is formed in the side portion of the fin-shaped semiconductor regions 13a to 13d, wherein the implantation dose of the second impurity region 17b is determined primarily by the adsorbed species (a neutral species such as gas molecules or radicals) 18b. In this process, since there are ions that are incident on the side surface of the fin-shaped semiconductor regions 13a to 13d from an inclined direction, there are present the implanted ions 18a and the impurity 18c that is desorbed from the fin-shaped semiconductor regions 13a to 13d by sputtering, but nevertheless the influence thereof is very little as compared with the adsorbed species 18b and doping by the adsorbed species 18b will be dominant. Specifically, the number of the implanted ions 18a doped into the side portion of the fin-shaped semiconductor regions 13a to 13d and the impurity 18c desorbed from the side portion of the fin-shaped semiconductor regions 13a to 13d by sputtering is very small as compared with the number of the implanted ions 18a doped into the upper portion of the fin-shaped semiconductor regions 13a to 13d and the impurity 18c desorbed from the upper portion of the fin-shaped semiconductor regions 13a to 13d by sputtering.

As described above, the difference between the doping of the upper portion and that of the side portion of the fin-shaped semiconductor regions 13a to 13d occurs because the influence of the implanted ions 18a and the influence of the impurity 18c desorbed from the fin-shaped semiconductor regions 13a to 13d by sputtering are significant in the upper portion of the fin-shaped semiconductor regions 13a to 13d, whereas these influences are very little in the side portion of the fin-shaped semiconductor regions 13a to 13d. The amount of the impurity 18c desorbed from the fin-shaped semiconductor regions 13a to 13d by sputtering is also influenced by the amount of the implanted ions 18a and the implantation energy. Thus, the fundamental difference between the doping of the upper portion and that of the side portion of the fin-shaped semiconductor regions 13a to 13d is that the amount of the implanted ions 18a incident on the upper surface of the fin-shaped semiconductor regions 13a to 13d is very different from that incident on the side surface of the fin-shaped semiconductor regions 13a to 13d, i.e., the difference occurs because the amount of the implanted ions 18a incident on the upper surface of the fin-shaped semiconductor regions 13a to 13d is much larger than the side surface of the fin-shaped semiconductor regions 13a to 13d.

Therefore, by making the amount of the implanted ions 18a incident on the upper surface of the fin-shaped semiconductor regions 13a to 13d very small, the fundamental difference between the doping of the upper surface and that of the side surface of the fin-shaped semiconductor regions 13a to 13d can be substantially reduced. Specifically, by making the amount of the implanted ions 18a incident on the fin-shaped semiconductor regions 13a to 13d very small, the amount of the implanted ions 18a implanted into the upper portion of the fin-shaped semiconductor regions 13a to 13d is made very small while the amount of the impurity 18c desorbed from the upper portion is also made very small. Then, in the upper portion of the fin-shaped semiconductor regions 13a to 13d, the influence of the implanted ions 18a on the implantation dose relatively becomes smaller than the influence of the adsorbed species 18b on the implantation dose, whereby doping by the adsorbed species 18b becomes the primary factor that influences the implantation dose. In the side portion of the fin-shaped semiconductor regions 13a to 13d, doping by the adsorbed species 18b is dominant in the first place. As a result, both in the upper portion and the side portion of the fin-shaped semiconductor regions 13a to 13d, the implantation dose is substantially determined by the amount of doping by the adsorbed species 18b. Since the amount of doping by the adsorbed species 18b is an amount that is determined by adsorption of a neutral species (such as gas molecules or radicals) moving in random directions without being influenced by the electric field, the amount of doping is equal for the upper portion and for the side portion of the fin-shaped semiconductor regions 13a to 13d. Thus, the implantation dose of the first impurity region 17a can be made equal to that of the second impurity region 17b.

Note that also in the formation of the source-drain region 27, the implantation dose in the third impurity region (the upper portion of the semiconductor region) 27a and that in the fourth impurity region (the side portion of the semiconductor region) 27b can be made equal to each other by using a mechanism similar to that for the formation of the extension region 17.

A method for making the implantation dose of the fin upper portion (the first impurity region 17a) and that of the fin side portion (the second impurity region 17b) equal to each other will now be described by way of specific examples.

First Example

In the first example, plasma doping is performed while setting the pressure during plasma doping to be less than or equal to 0.6 Pa, whereby it is possible to obtain a high conformal doping property while suppressing the amount of chipping of the upper corner (the fin corner portion) of the fin-shaped semiconductor region.

[Suppression of Amount of Chipping of Fin Corner Portion]

First, the suppression of the amount of chipping of the fin corner portion in the first example will be described with reference to FIGS. 4A and B.

Figure 4A:
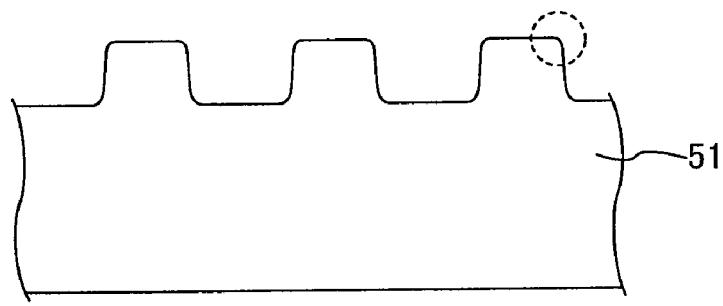
FIG. 4A schematically shows a cross-sectional shape of a fin-shaped semiconductor region before plasma doping according to a first example of the first embodiment of the present invention, and FIG. 4B schematically shows a cross-sectional shape of a fin-shaped semiconductor region after plasma doping according to the first example of the first embodiment of the present invention.

FIG. 4A schematically shows a cross-sectional shape of the fin-shaped semiconductor region (strictly, a semiconductor region 51 having fins) before plasma doping. The height and the width of the fin are 120 nm and 160 nm, respectively, and the distance between fins is 210 nm. Thus, the distance between the center of a fin in the width direction and that in an adjacent fin is 370 nm. Moreover, the radius of curvature of the fin corner portion (the region indicated by a broken line in the figure) is 8.7 nm. Note that the fin corner portion is in a shape with a curvature, but not a completely right-angled shape, even before plasma doping because the fin corner portion is chipped off slightly in the dry etching step and the cleaning step before plasma doping.

Figure 4B:
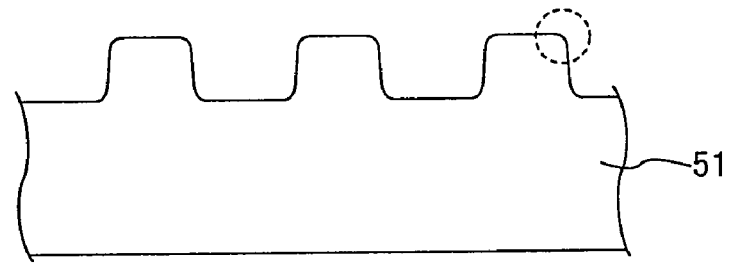

FIG. 4B schematically shows a cross-sectional shape of the fin-shaped semiconductor region (strictly, the semiconductor region 51 having fins) after plasma doping. The plasma doping condition is such that, for example, the material gas is $B_2H_6$ diluted with He, the $B_2H_6$ concentration in the material gas is 0.5% by mass, the chamber pressure is 0.35 Pa, the source power (the plasma-generating high-frequency power) is 600 W, the bias voltage Vpp is 130V, the substrate temperature is 20° C., and the plasma doping time is 200 seconds. An ICP method, for example, was used as a plasma generating method. Note that in the first example, in order to make the amount of implanted ions incident on the fin upper surface very small to suppress the amount of chipping of the fin corner portion, the chamber pressure is set to be 0.35 Pa, a very small value for an ICP method. The radius of curvature of the fin corner portion (the region indicated by a broken line in the figure) after plasma doping is performed under such a condition is 10.6 nm. Thus, in the first example, the difference between the radius of curvature of the fin corner portion before plasma doping and that after plasma doping is 1.9 nm, which is the amount of change over a plasma doping time of 200 seconds, and therefore it can be seen that the amount of chipping (the amount of increase in the radius of curvature) per minute is 0.6 nm, which is a very small value.

[Conformal Doping Property]

Figure 5C:
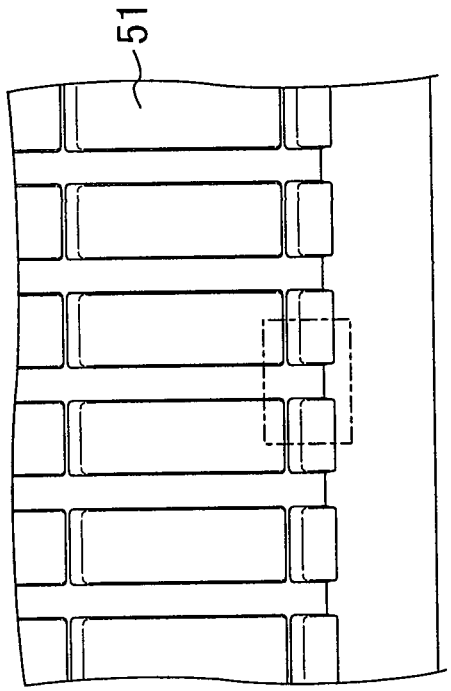
FIG. 5C is a perspective view of the fin-shaped semiconductor region shown in FIGS. 5A and B.
Figure 5D:
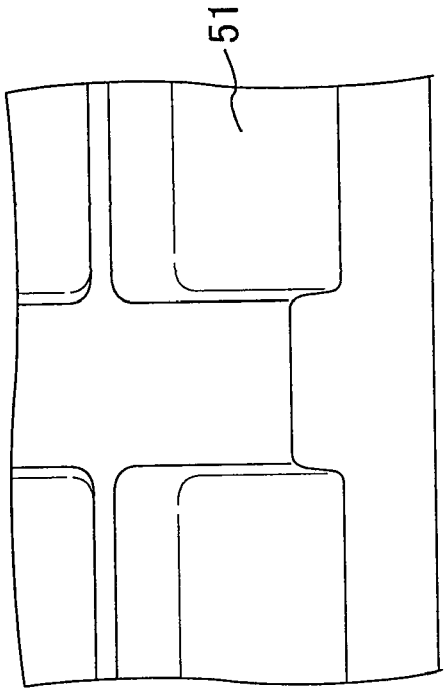
FIG. 5D is an enlarged view thereof.
Figure 5A:
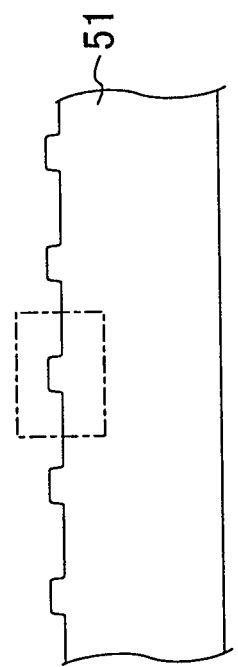
FIG. 5A is a diagram schematically showing a cross-sectional shape of a fin-shaped semiconductor region before plasma doping according to the first example of the first embodiment of the present invention.
Figure 5B:
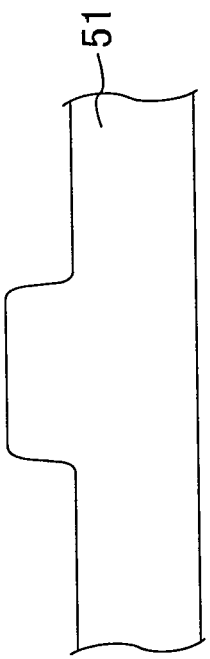
FIG. 5B is an enlarged view thereof.

Next, the sheet resistance of the first impurity region (the impurity region of the fin upper portion) and that of the second impurity region (the impurity region of the fin side portion) in the first example will be described with reference to the drawings. The plasma doping condition is such that, for example, the material gas is $B_2H_6$ diluted with He, the $B_2H_6$ concentration in the material gas is 0.8% by mass, the chamber pressure is 0.35 Pa, the source power (the plasma-generating high-frequency power) is 500 W, the bias voltage Vpp is 250V, the substrate temperature is 20° C., and the plasma doping time is 60 seconds. An ICP method, for example, was used as a plasma generating method. Moreover, the chamber pressure is set to be 0.35 Pa, a very small value for an ICP method, in order to make the amount of implanted ions incident on the fin upper surface very small so that the amount of doping by the adsorbed species is the main factor influencing the implantation dose of the first impurity region (the fin upper portion); in other words, so that the implantation dose of the first impurity region (the fin upper portion) approaches that of the second impurity region (the fin side portion) where the main factor is the amount of doping by the adsorbed species in the first place. The amount of chipping of the fin corner portion in this case is also very small, and about the same as that described above in [Suppression Of Amount Of Chipping Of Fin Corner Portion]. FIG. 5A is a diagram schematically showing a cross-sectional shape of the fin-shaped semiconductor region (strictly, the semiconductor region 51 having fins) before plasma doping, FIG. 5B is an enlarged view thereof, FIG. 5C is a perspective view of the fin-shaped semiconductor region shown in FIGS. 5A and B, and FIG. 5D is an enlarged view thereof. The height and the width of the fin-shaped semiconductor region shown in FIGS. 5A-D are 128 nm and 342 nm, respectively, and the distance between fins is 743 nm. Thus, the distance between the center of a fin in the width direction and that in an adjacent fin is 1085 nm.

Figure 6A:
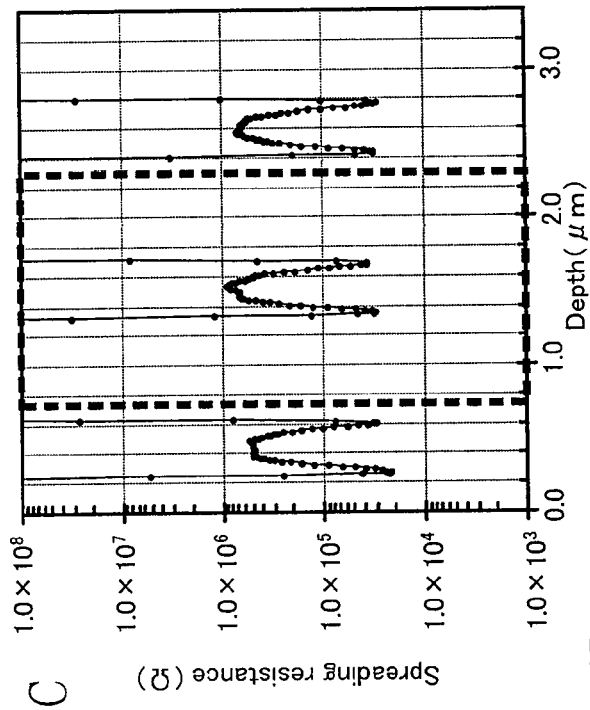
FIG. 6A schematically shows a cross-sectional structure of a fin-shaped semiconductor region after plasma doping according to the first example of the first embodiment of the present invention.

FIG. 6A shows how a low-resistance region 52 is formed by implanting boron into silicon of the fin-shaped semiconductor region (strictly, the semiconductor region 51 having fins) by plasma doping and then performing a heat treatment by a spike RTA (rapid thermal annealing) at 1050° C. to thereby electrically activate boron in silicon. As shown in FIG. 6a, the low-resistance region 52 is formed not only in the first impurity region (fin upper portion) but also in the second impurity region (the fin side portion).

Figure 6B:
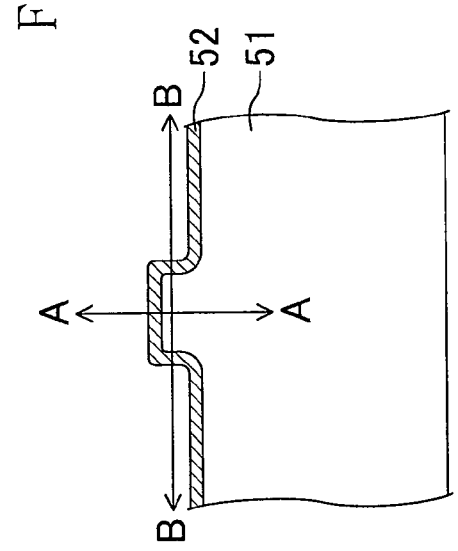
FIG. 6B shows the transition of the spreading resistance along line A-A in FIG. 6A.

FIG. 6B shows the transition of the spreading resistance as measured by using SSRM (2D Scanning Spreading Resistance Microscopy) along line A-A in FIG. 6A. In FIG. 6D, the zero point along the horizontal axis means the fin upper surface. As shown in FIG. 6B, the spreading resistance of the first impurity region (fin upper portion) is $2.9\times10^4\Omega$. Moreover, as the depth along the horizontal axis increases (i.e., more into the fin), the distance from the first impurity region (the low-resistance region 52 of the fin upper portion) increases. A region away from the fin upper surface by about 0.3 μm or more is a region into which boron has not been implanted or has not substantially diffused by heat treatment, and a spreading resistance of the substrate (about $1.5\times10^6\Omega$) is observed in this region.

Figure 6C:
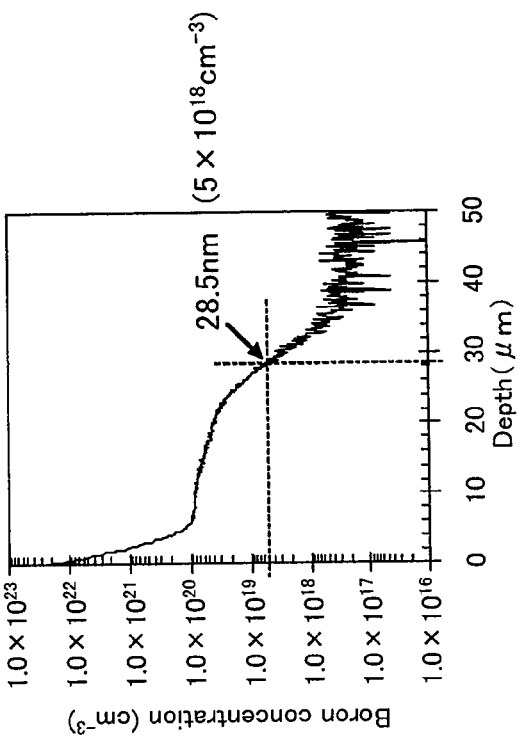
FIG. 6C shows the transition of the spreading resistance along line B-B in FIG. 6A.
Figure 6D:
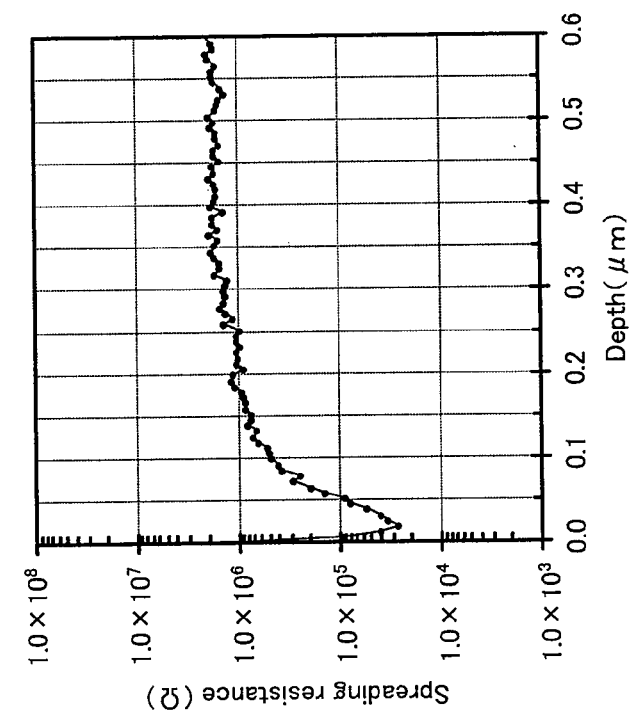
FIG. 6D shows the results of the SIMS measurement of the first impurity region (the fin upper portion) formed in the first example of the first embodiment of the present invention.

Next, FIG. 6C shows the transition of the spreading resistance along line B-B in FIG. 6A. Note that FIG. 6C shows the results of an SSRM observation of a portion where three fins as shown in FIG. 6A are arranged together, and the zero point along the horizontal axis in FIG. 6C means a position at a predetermined distance from the left-side surface of the leftmost fin to the left along line B-B. The region delimited by a thick broken line in FIG. 6C represents the spreading resistance of the semiconductor region including the fin shown in FIG. 6A. Referring to the region delimited by the thick broken line, in a region where the depth along the horizontal axis is small (e.g., a region where the depth along the horizontal axis is around 1.0 μm), the spreading resistance of an insulator (not shown in FIG. 6A) provided between fins for the purpose of SSRM measurement is observed, whose value is very high. A region where the depth along the horizontal axis is around 1.35 μm corresponds to the second impurity region located in a left-side portion of the fin shown in FIG. 6A, and the spreading resistance of this portion is $3.0\times10^4\Omega$. A region where the depth along the horizontal axis is around 1.5 μm corresponds to the central portion of the fin shown in FIG. 6A, i.e., a portion surrounded by the first impurity region (the fin upper portion) and two second impurity regions (opposing side portions of the fin), and this is a region into which boron has not been implanted or has not so much diffused by heat treatment, whereby a value close to the spreading resistance of the substrate is observed as the spreading resistance of this portion. A region where the depth along the horizontal axis is around 1.7 μm corresponds to the second impurity region located in a right-side portion of the fin shown in FIG. 6A, and the spreading resistance of this portion is $3.5\times10^4\Omega$. Moreover, in a region where the depth along the horizontal axis is greater than 1.7 μm (e.g., a region where the depth along the horizontal axis is around 2.0 μm), the spreading resistance of an insulator (not shown in FIG. 6A) provided between fins for the purpose of SSRM measurement is again observed, whose value is very high. As described above, the spreading resistances of the six second impurity regions located in the opposing side portions of the three fins as represented in FIG. 6C are observed to be, from left to right, $2.1\times10^4\Omega$, $3.0\times10^4\Omega$, $3.0\times10^4\Omega$, $3.5\times10^4\Omega$, $3.0\times10^4\Omega$ and $2.9\times10^4\Omega$, and the average value of the spreading resistances of the six second impurity regions is $2.9\times10^4\Omega$. This is equal to the spreading resistance of the first impurity region (the fin upper portion) shown in FIG. 6B.

In order to compare the sheet resistance of the first impurity region (fin upper portion) and that of the second impurity region (the fin side portion) with each other, it is necessary to identify the junction depths thereof in addition to the spreading resistances thereof. The junction depth of the first impurity region (the fin upper portion) can be evaluated by performing the SIMS (secondary ion mass spectrometry) measurement on a sample produced under the same condition as that for the fin-shaped semiconductor region shown in FIG. 6A using another bare silicon substrate. FIG. 6D shows the results of the SIMS measurement of the first impurity region (the fin upper portion). It can be seen that as shown in FIG. 6D, where the depth at which the boron concentration is $5\times10^{18}$ cm$^{-3}$ is defined as the junction depth, the junction depth of the first impurity region (the fin upper portion) is 28.5 nm. Moreover, the sheet resistance of the first impurity region (the fin upper portion) can be evaluated by performing a four-point probe method on a sample produced under the same condition as that for the fin-shaped semiconductor region shown in FIG. 6A using another bare silicon substrate. Based on the results of the measurement by the four-point probe method, it was found that the sheet resistance of the first impurity region (the fin upper portion) is 750Ω/□. The junction depth of the second impurity region (the side portion of the semiconductor region) can be obtained, by using the results of the SSRM observation, as being the depth of the second impurity region (the fin side portion) at which the color tone of the second impurity region (the fin side portion) is the same as that of the first impurity region (the fin upper portion) at a depth of 28.5 nm. In such a case, although there is a measurement error by the size of a dot in the SSRM picture, the junction depth of the second impurity region (the fin side portion) can be identified with a precision of 28.5 nm±10%.

Herein, Rs=ρ/t is satisfied, where Rs is a sheet resistance of a target, ρ is the specific resistance, t is a thickness (junction depth), and ρw is a spreading resistance. The specific resistance ρ and the spreading resistance ρw are in principle in a one-to-one relationship, and are substantially in a one-to-one relationship also in the measurement above, whereby a proportional relationship is established between Rs and ρw/t. From the experiment, the spreading resistance ρw of the first impurity region (the fin upper portion) is $2.9\times10^4\Omega$, and the thickness (the junction depth) t thereof is 28.5 nm. In contrast, the spreading resistance ρw of the second impurity region (the fin side portion) is $2.9\times10^4\Omega$, and the thickness (the junction depth) t thereof is 28.5 nm±10%. Thus, it can be seen that the sheet resistance of the first impurity region (the fin upper portion) and that of the second impurity region (the fin side portion) are in a range from 1:1.1 to 1:0.9. In other words, in the first example, the sheet resistance of the first impurity region (the fin upper portion) and that of the second impurity region (the fin side portion) can be made equal to each other with a slight difference of ±10%, which represents a conformal doping capability that cannot be achieved by the conventional techniques.

Figure 7:
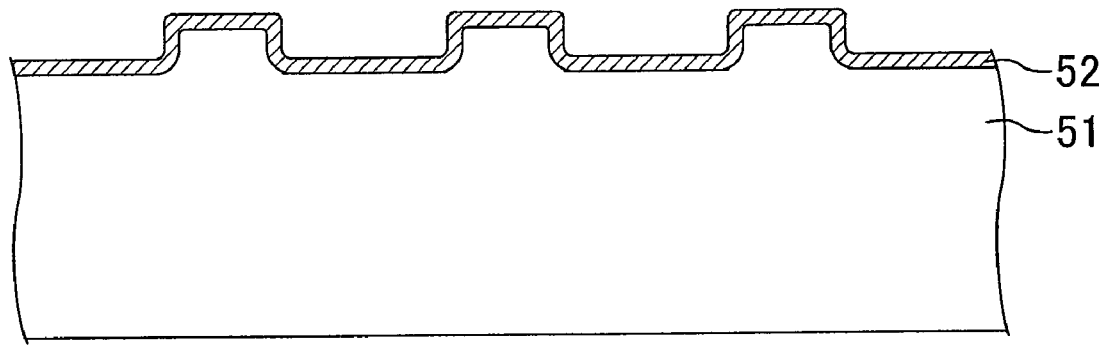
FIG. 7 schematically shows a cross-sectional structure of a fin-shaped semiconductor region after plasma doping according to the first example of the first embodiment of the present invention.

FIG. 7 shows how the low-resistance region 52 is formed by implanting an impurity into the semiconductor region 51 having fins whose aspect ratio is 0.37 and whose pitch is 1085 nm by plasma doping, and then performing a heat treatment to thereby activate the impurity.

Figure 8:
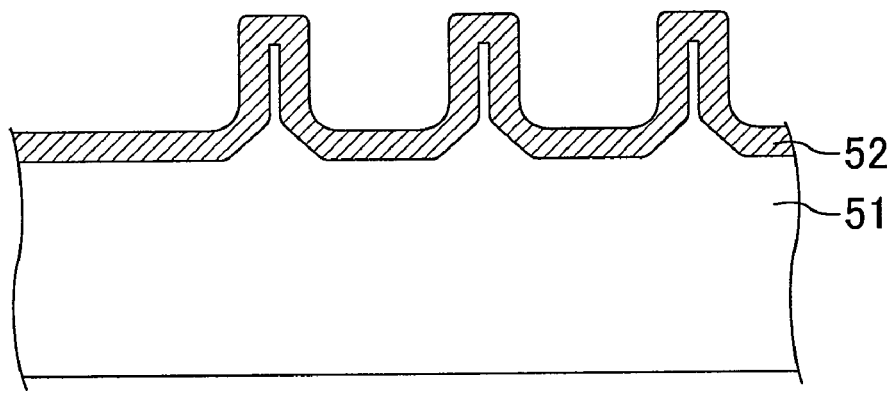
FIG. 8 schematically shows a cross-sectional structure of a fin-shaped semiconductor region after plasma doping according to the first example of the first embodiment of the present invention.

FIG. 8 shows how the low-resistance region 52 is formed by implanting an impurity into the semiconductor region 51 having fins whose aspect ratio is 1.72 and whose pitch is 196 nm by plasma doping, and then performing a heat treatment to thereby activate the impurity.

Conformal doping was achieved with both plasma doping processes of FIGS. 7 and 8.

[Parameter Dependency of Threshold Value of Pressure During Plasma Doping]

As described above, the first example has illustrated that it is possible to control the amount of chipping of the fin corner portion by performing plasma doping while setting the pressure during plasma doping to be less than or equal to 0.6 Pa, by way of an example where the material gas is $B_2H_6$ diluted with He, the $B_2H_6$ concentration in the material gas is 0.5% by mass, the chamber pressure is 0.35 Pa, and the source power (the plasma-generating high-frequency power) is 600 W, the bias voltage Vpp is 130 V, the substrate temperature is 20° C., and the plasma doping time is 200 seconds. Moreover, the first example has illustrated that it is possible to obtain a high conformal doping property by performing plasma doping while setting the pressure during plasma doping to be less than or equal to 0.6 Pa by way of an example where the material gas is $B_2H_6$ diluted with He, the $B_2H_6$ concentration in the material gas is 0.8% by mass, the chamber pressure is 0.35 Pa, the source power (the plasma-generating high-frequency power) is 500 W, the bias voltage Vpp is 250 V, the substrate temperature is 20° C., and the plasma doping time is 60 seconds. Note however that the threshold value of the pressure during plasma doping for obtaining a high conformal doping property while suppressing the amount of chipping of the fin corner portion varies depending on other parameters, which will now be described.

First, while the first example employs boron as an element to be electrically active in a semiconductor, a case where phosphorus or arsenic, for example, is used instead will now be described. This corresponds to a case where $PH_3$ or $AsH_3$ diluted with He, for example, is used as the material gas instead of $B_2H_6$ diluted with He. Since the atomic weight of boron is 10.8, the atomic weight of phosphorus is 40.0, and the atomic weight of arsenic is 74.9, phosphorus is an element that is about 4 times heavier than boron, and arsenic is an element that is as much as about 7 times heavier than boron. However, in plasma doping, $B_2H_6$, $PH_3$, $AsH_3$, or the like, is diluted with a rare gas such as hydrogen or helium to 5% by mass or less. Particularly, in an application where an element is implanted in order to form an extension region or a source-drain region as in the present invention, it is desirable that boron, phosphorus, arsenic, or the like, is implanted in a dose range from $5 \times 10^4$ cm$^{-2}$ to $5 \times 10^5$ cm$^{-2}$. On the other hand, where $B_2H_6$, $PH_3$, $AsH_3$, or the like, is used while being diluted to 2% by mass or more, there is likely to be a problem that the dose of boron, phosphorus, arsenic, or the like, will be as much as $5 \times 10^{15}$ cm$^{-2}$ or more. Therefore, it is desirable to use $B_2H_6$, $PH_3$, $AsH_3$, or the like, with a high degree of dilution of about 2% by mass or less. In such a case, ions from the diluent gas account for 98% by mass or more of the ion source in a plasma. What chips off the fin corner portion is ions in a plasma, the majority of which is ions from the diluent gas, which are dominant as ions in a plasma. Thus, even if the doping element is changed from boron to phosphorus or arsenic, the proportion of phosphorus ions or arsenic ions in the plasma with respect to ions from the diluent gas is not substantially different from the proportion of boron ions in the plasma with respect to ions from the diluent gas. Therefore, even if the doping element is changed from boron to phosphorus or arsenic, it is not necessary to substantially change the threshold value of the pressure during plasma doping. Note however that taking into consideration that phosphorus or arsenic is a heavier element than boron, it is preferred to set the threshold value of the pressure during plasma doping to be lower than 0.6 Pa, e.g., about 0.5 Pa.

Moreover, while the first example has been described with respect to a case where the material gas is $B_2H_6$ diluted with He and the $B_2H_6$ concentration in the material gas is 0.5% by mass or 0.8% by mass, a case where the $B_2H_6$ concentration is changed will next be described. Also in such a case, $B_2H_6$ is diluted with hydrogen or a rare gas such as helium to 5% by mass or less, whereby the change in the $B_2H_6$ concentration has substantially no influence on the threshold value of the pressure during plasma doping. In an application where an element is implanted in order to form an extension region or a source-drain region as in the present invention, it is desirable that $B_2H_6$ is used with a high degree of dilution of about 2% by mass or less as described above, whereby the $B_2H_6$ concentration in the material gas has little influence on the amount of chipping of the fin corner portion. It is believed that the reason is that as described above, what chips off the fin corner portion is ions in a plasma, the majority of which is ions from the diluent gas, which are dominant as ions in a plasma, whereby even if the proportion (concentration) of boron in the diluent gas is changed within a range of 5% by mass or less (preferably, a range of 2% by mass or less), the proportion of boron ions in a plasma with respect to ions from the diluent gas does not substantially change. As described above, where the material gas is $B_2H_6$ diluted with He and the $B_2H_6$ concentration in the material gas is in a range of 2% by mass or less, the influence of the change in the $B_2H_6$ concentration on the amount of chipping of the fin corner portion is negligible, and the threshold value of the pressure during plasma doping remained to be 0.6 Pa. Thus, the cause of etching the fin corner portion in plasma doping is the ions from the diluent gas (helium ions in the first example), and the threshold value of the pressure during plasma doping is not dependent on the $B_2H_6$ concentration, i.e., the boron concentration. This similarly applies also where phosphorus, arsenic, or the like, for example, is used instead of boron.

While the first example has been described with respect to a case where the bias voltage Vpp is 130 V and 250 V, a case where the bias voltage Vpp is changed will next be described. With an apparatus for an application where an element is implanted in order to form an extension region or a source-drain region as in the present invention, the bias voltage Vpp is set to be less than or equal to 1000 V. In order to form an extension region, it is desirable that boron, phosphorus, arsenic, or the like, is implanted into a region at a depth of greater than or equal to 5 nm and less than or equal to 15 nm from the semiconductor surface. Where a bias voltage Vpp of 250 V is used in the first example, the implantation depth (defined as the depth at which the boron concentration is $1 \times 10^{18}$ cm$^{-3}$) is 9 nm. Even if the bias voltage Vpp is increased to about 500 V in order to make the implantation depth to be 15 nm, which is the maximum value desired for the extension region, the threshold value of the pressure during plasma doping remained to be about 0.6 Pa and did not substantially change. Note however that where the bias voltage Vpp is increased to about 1000 V, which is the maximum output of the apparatus, it is preferred that the threshold value of the pressure during plasma doping is set to be lower than 0.6 Pa, e.g., about 0.5 Pa.

Figure 9:
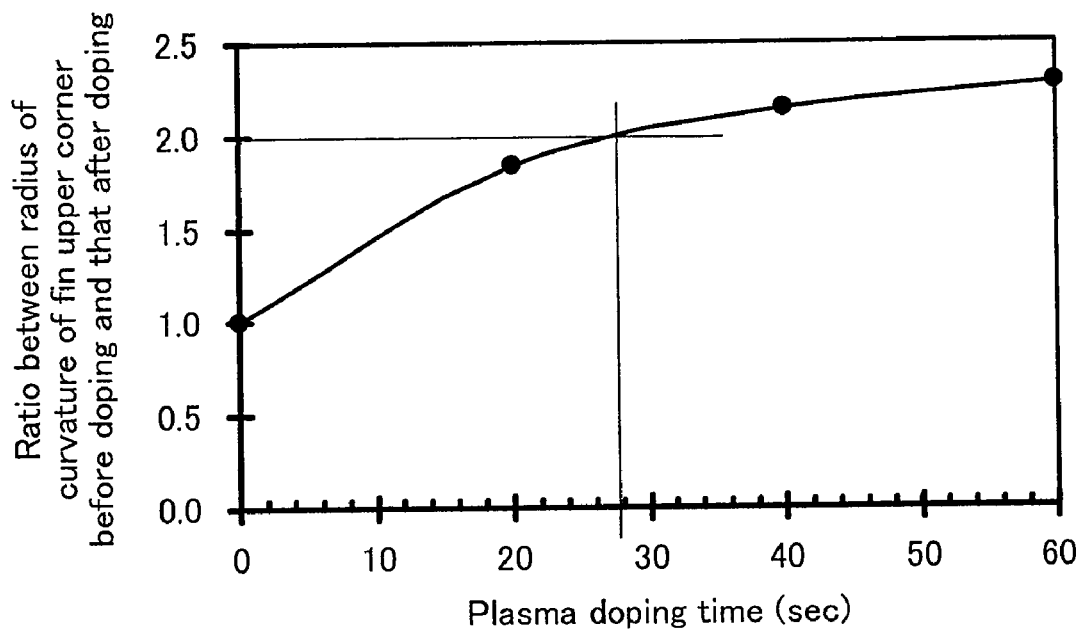
FIG. 9 shows the change in the amount of chipping of the fin corner portion over time according to the first example of the first embodiment of the present invention.

Moreover, while the first example has been described above with respect to a case where the plasma doping time is 60 seconds and 200 seconds, a case where the plasma doping time is changed will next be described. There is a tendency that the threshold value of the pressure during plasma doping becomes higher than 0.6 Pa as the plasma doping time is decreased, whereas the threshold value of the pressure during plasma doping becomes lower than 0.6 Pa as the plasma doping time is increased. Thus, although it may seem possible to perform plasma doping in a pressure range higher than 0.6 Pa by decreasing the plasma doping time to be shorter than 60 seconds, this is not an effective method, for the following reasons, except when the plasma doping time is set to be very short. When plasma doping is performed for less than 60 seconds using a pressure range higher than 0.6 Pa, the amount of chipping of the fin corner portion with respect to time does not change proportionally, but the amount of chipping is greater in an initial stage of plasma doping, as shown in FIG. 9. FIG. 9 shows the change in the amount of chipping of the fin corner portion over time where plasma doping at a pressure of 0.9 Pa is performed for 60 seconds. Note that in FIG. 9, the amount of chipping of the fin corner portion is represented as the ratio of the radius of curvature of the fin corner portion (the upper corner) after doping with respect to that before doping. The greater the ratio is, the greater the amount of chipping is. Specifically, as shown in FIG. 9, with 28 seconds or more, the radius of curvature of the fin corner portion after plasma doping is twice or more of that before plasma doping, resulting in a large amount of chipping. Therefore, with plasma doping using a long doping time of 28 seconds or more, it is preferred that the pressure is set to be less than or equal to 0.6 Pa in order to suppress the amount of chipping of the fin corner portion. Where the plasma doping time is less than 28 seconds, it is possible to perform plasma doping while reducing the amount of chipping of the fin corner portion even if the pressure is greater than or equal to 0.6 Pa. However, with plasma doping using such a short doping time, there is a significant problem that it is difficult to ensure a dose uniformity across the substrate surface. Where the plasma doping time is set to be longer than 200 seconds, the productivity decreases. As described above, with plasma doping using a doping time from 30 seconds to 200 seconds, while there is an effect of ensuring a dose uniformity across the substrate surface without lowering the productivity, the amount of chipping of the fin corner portion will be large with a pressure range that has been used conventionally. In contrast, with the present invention, it is possible to reduce the amount of ions from the diluent gas (helium ions in the first example), which are believed to be the cause of etching, by setting the pressure during plasma doping to be less than or equal to 0.6 Pa, thereby realizing a special effect that it is possible to achieve a high conformal doping property while suppressing the amount of chipping of the fin corner portion.

Second Example

In the second example, it is possible to obtain a high conformal doping property while suppressing the amount of chipping of the fin corner portion by performing plasma doping under conditions where the pressure during plasma doping is set to be greater than or equal to 0.6 Pa and less than or equal to 10 Pa, and the ion current density Ii (mA/cm$^2$) and the pressure during plasma doping P(Pa) satisfy Ii≦0.52 Ln(P)+0.36. Note that Ln represents a natural logarithm.

The second example used a sample similar to that of the first example as shown in FIG. 4A as a fin-shaped semiconductor region (before plasma doping is performed) for examining the amount of chipping of the fin corner portion. Specifically, the height and the width of the fin are 120 nm and 160 nm, respectively, and the distance between fins is 210 nm. Thus, the distance between the center of a fin in the width direction and that in an adjacent fin is 370 nm. Moreover, the radius of curvature of the fin corner portion (the region indicated by a broken line in the figure) is 8.7 nm.

First, the pressure and the source power during plasma doping are changed to measure the electron temperature and the ion current density. The apparatus used for the measurement is a Langmuir probe manufactured by Scientific Systems (Trade name: Smart Probe). Moreover, the measurement probe is attached so as to be passed through 25 mm above the substrate surface so that the measurement can be done on a portion directly below. Twenty one locations within a range of a radius of 20 mm from the central position of a 300-mm substrate (specifically, 21 points with 1-mm intervals from the central position of the substrate to a position 20 mm from the central position to the side where the measurement probe is attached) are set as the measurement data detection points, with the average of the 21 measurement values being used as the measurement data.

Next, the amount of chipping of the fin corner portion is measured while changing the pressure and the source power during plasma doping. The plasma doping condition is such that the bias power is 135 W (the bias voltage Vpp is 290 V), the material gas is $B_2H_6$ diluted with He, the $B_2H_6$ concentration in the material gas is 0.05% by mass, the total flow rate of the gas is 300 cc/min (standard state), and the bias application time is 60 seconds. Note that the boron implantation depth, defined as the depth at which the boron concentration is 5×10$^{18}$ cm$^{-3}$, is about 9 nm.

Figure 10A:
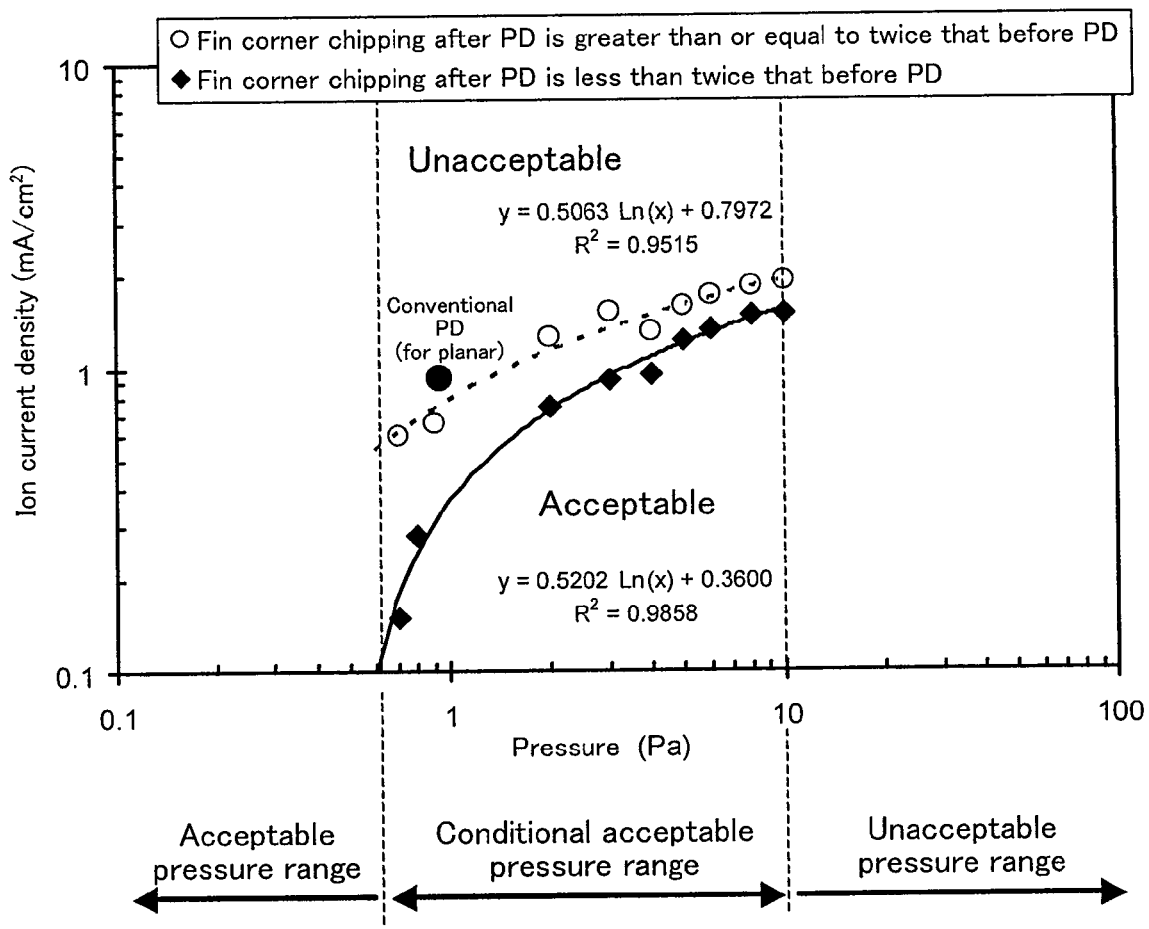
FIG. 10A shows the relationship between the pressure and the ion current density according to a second example of the first embodiment of the present invention.

FIGS. 10A and B represent various characteristics obtained from the measurement data described above. Specifically, FIG. 10A shows the range of ion current density where the radius of curvature of the fin corner portion after plasma doping is less than twice that before plasma doping and that where the radius of curvature of the fin corner portion after plasma doping is greater than or equal to twice that before plasma doping, in the range of pressure during plasma doping from 0.6 Pa to 10 Pa. Where the pressure is in the range from 0.6 Pa to 10 Pa, the range of ion current density where the radius of curvature of the fin corner portion after plasma doping is reliably less than twice that before plasma doping is Ii≦0.52 Ln(P)+0.36 (Relational Expression 1: y=0.5202 Ln(x)+0.3600 in the figure). Note that R$^2$=0.9858 in the figure represents the correlation coefficient between the measurement data and the approximate curve (Relational Expression 1), and the value of R$^2$ being close to 1 indicates that the correlation between Relational Expression 1 and the corresponding measurement data is very strong. The range of ion current density where the radius of curvature of the fin corner portion after plasma doping is reliably greater than or equal to twice that before plasma doping is Ii≧0.51 Ln(P)+0.80 (Relational Expression 2: y=0.5063 Ln(x)+0.7972 in the figure). Note that R$^2$=0.9515 in the figure represents the correlation coefficient between the measurement data and the approximate curve (Relational Expression 2), and the value of R$^2$ being close to 1 indicates that the correlation between Relational Expression 2 and the corresponding measurement data is very strong. In the figure, the plot labeled "conventional PD (for planar)" represents the ion current density obtained where plasma doping is performed with a pressure of 0.9 Pa as described above in FIG. 9. As shown in FIG. 9, when plasma doping is performed for 60 seconds with a pressure of 0.9 Pa and the ion current density, the radius of curvature of the fin corner portion after plasma doping is greater than or equal to twice that before plasma doping.

Figure 10B:
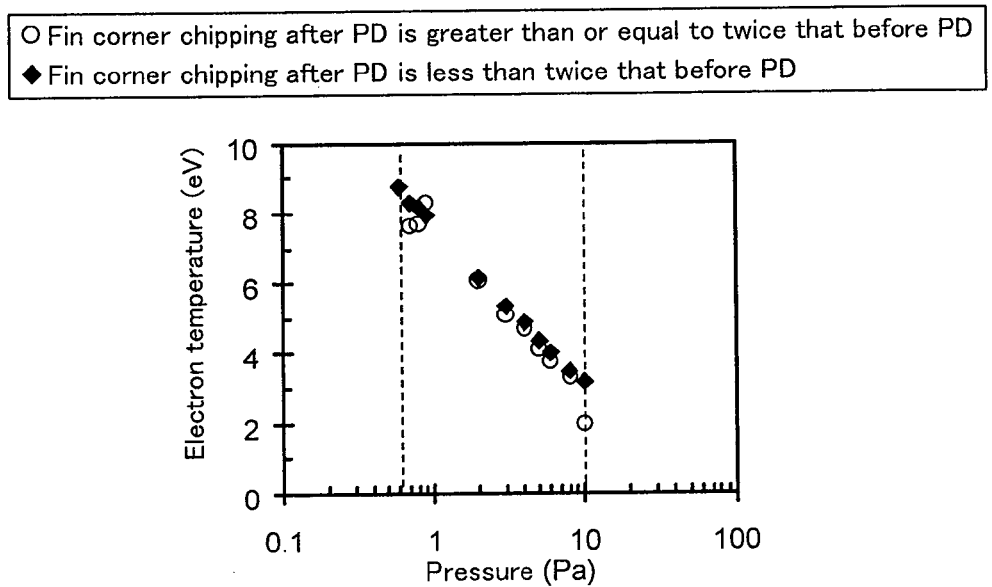
FIG. 10B shows the relationship between the pressure and the electron temperature according to the second example of the first embodiment of the present invention.

Note that while the relationship between the ion current density and the pressure such that the radius of curvature of the fin corner portion after plasma doping is exactly twice that before plasma doping lies between the region represented by Relational Expression 1 and that represented by Relational Expression 2, the identification thereof requires an enormous effort. Therefore, the second example only identifies Relational Expression 1 where the radius of curvature of the fin corner portion after plasma doping is reliably less than twice that before plasma doping and Relational Expression 2 where the radius of curvature of the fin corner portion after plasma doping is reliably greater than or equal to twice that before plasma doping. FIG. 10B shows the relationship between the pressure and the electron temperature where the equations of Relational Expression 1 and Relational Expression 2 hold in the range of pressure during plasma doping from 0.6 Pa to 10 Pa. It can be seen from FIGS. 10A and B that even if the electron temperature is at the same level, the amount of chipping of the fin corner portion may vary due to the difference in the ion current density, more specifically, that the amount of chipping of the fin corner portion can be better suppressed as the ion current density is smaller.

Figure 21:
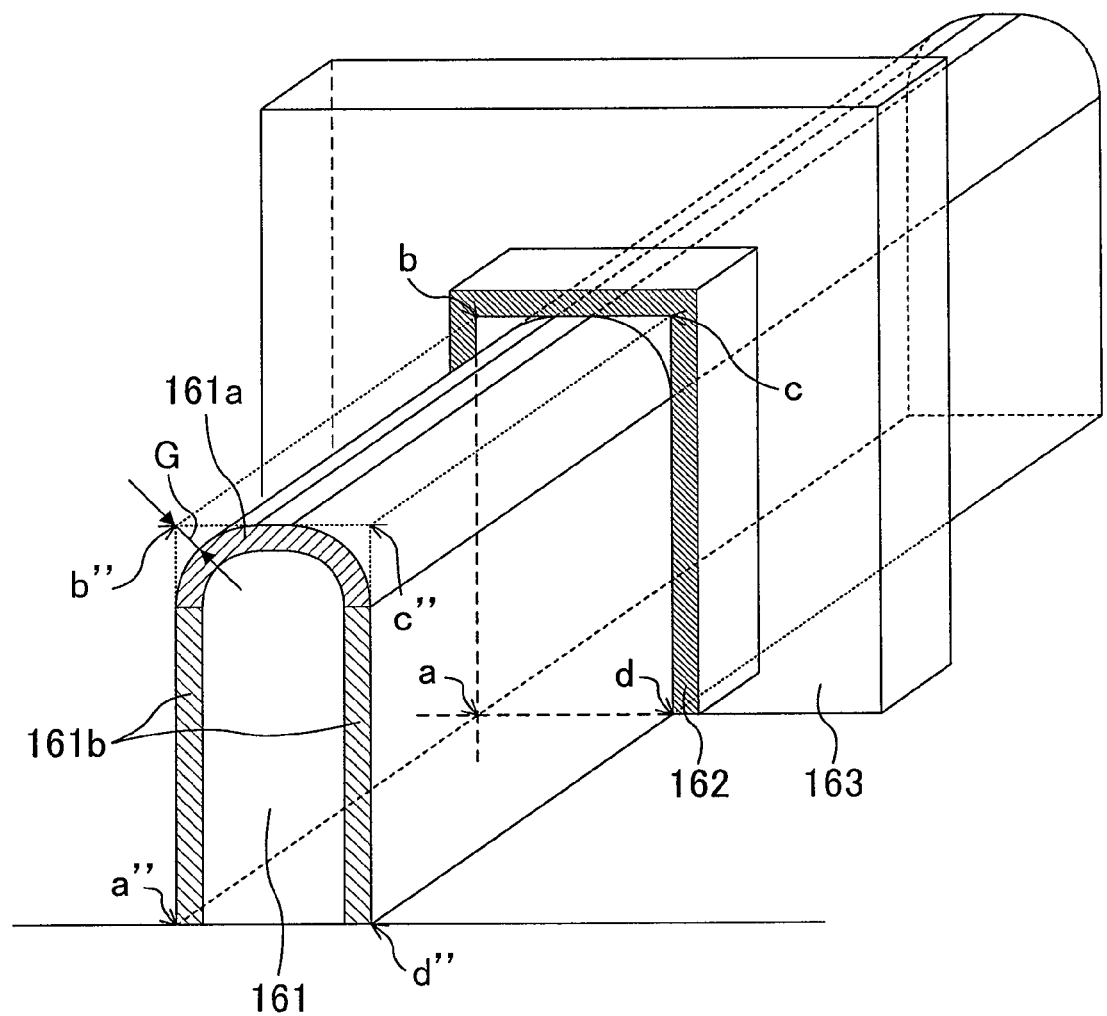
FIG. 21 is a perspective view schematically showing a structure of a conventional semiconductor device.

Note that as long as the radius of curvature after plasma doping is less than twice that before plasma doping, the influence of the radius of curvature of the fin corner portion on the performance of the semiconductor device is within an acceptable range and will not present problems. The reason is as follows. That is, of the current flowing from the source to the drain passing through a portion under the gate insulating film, it is more difficult for a current to flow through near the boundary between the first impurity region (the fin upper portion) and the second impurity region (the fin side portion) because the gap between the gate insulating film and the impurity region increases (see FIG. 21). Therefore, as long as the radius of curvature of the fin corner portion after plasma doping is less than twice that before plasma doping, the gap between the gate insulating film and the impurity region is small, whereby the influence on the performance of the semiconductor device is within an acceptable range and will not present problems. Herein, the amount of chipping of the fin corner portion does not correspond directly to the size of the gap between the gate insulating film and the impurity region, but the size of the gap between the gate insulating film and the impurity region, which occurs unintentionally due to plasma doping, is smaller than the amount of chipping of the fin corner portion. The reason is as follows. With respect to the radius of curvature of the fin corner portion in practice, as the distance from the gate insulating film (see, for example, the distance D in FIG. 12) increases, the fin corner portion is more likely to be chipped off during plasma doping, thus increasing the radius of curvature, whereas as the distance from the gate insulating film (see, for example, the distance D in FIG. 12) decreases, the fin corner portion is less likely to be chipped off, thus decreasing the radius of curvature. Thus, the radius of curvature of the fin corner portion changes according to the distance from the gate insulating film, and the radius of curvature of the fin corner portion tends to decrease as the distance decreases, whereby there are cases where the size of the gap between the gate insulating film and the impurity region is smaller than the amount of chipping of the fin corner portion.

If the radius of curvature of the fin corner portion after plasma doping is greater than or equal to twice that before plasma doping, the gap between the gate insulating film and the impurity region becomes so large that the influence on the performance of the semiconductor device exceeds the acceptable range even if it is taken into consideration that the radius of curvature of the fin corner portion changes according to the distance from the gate insulating film.

Figure 11:
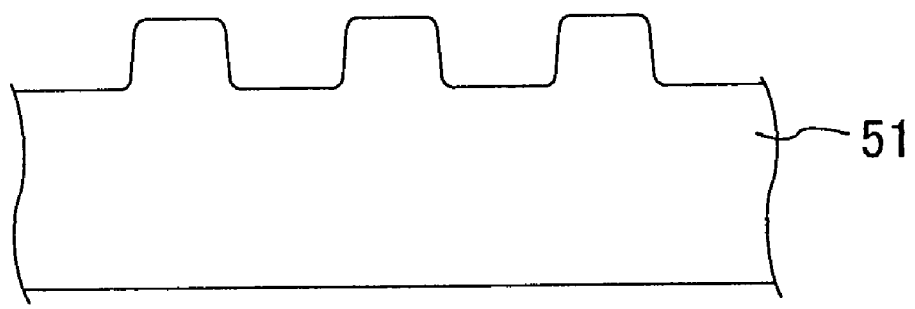
FIG. 11 schematically shows a cross-sectional shape of a fin-shaped semiconductor region after plasma doping according to the second example of the first embodiment of the present invention.

FIG. 11 schematically shows a cross-sectional shape of a fin-shaped semiconductor region (strictly, the semiconductor region 51 having fins) after plasma doping is performed in the second example. The plasma doping condition is such that, for example, the material gas is $B_2H_6$ diluted with He, the $B_2H_6$ concentration in the material gas is 0.05% by mass, the chamber pressure is 0.9 Pa, the source power (the plasma-generating high-frequency power) is 1000 W, the bias voltage Vpp is 290 V, the substrate temperature is 20° C., and the plasma doping time is 60 seconds. An ICP method, for example, was used as a plasma generating method. Note that in the second example, in order to make the amount of implanted ions incident on the fin upper surface very small to suppress the amount of chipping of the fin corner portion, the chamber pressure is set to be as small as 0.9 Pa and the source power is set to be as small as 1000 W, thus setting the ion current density to be 0.09 mA/cm², a very small value for an ICP method. The radius of curvature of the fin corner portion after plasma doping is performed under such a condition (FIG. 11) is 15.2 nm. Thus, in the second example, the difference between the radius of curvature of the fin corner portion before plasma doping and that after plasma doping is 6.5 nm, and the amount of chipping (the amount of increase in the radius of curvature) per minute is 6.5 nm. Moreover, in the second example, the radius of curvature of the fin corner portion after plasma doping is less than twice that before plasma doping, and it can therefore be seen that the amount of chipping of the fin corner portion is acceptably small.

Note that it can be seen that if the ion current density during plasma doping is less than or equal to 0.5 mA/cm² as shown in FIG. 10A, the influence of the amount of chipping of the fin corner portion on the performance of the semiconductor device is within an acceptable range and will not present problems. In view of this, it is understood that it is preferred to set the pressure during plasma doping to be less than or equal to 0.6 Pa as described above in the first example.

[Structure of Semiconductor Device Obtained in First Example and Second Example]

Figure 12:
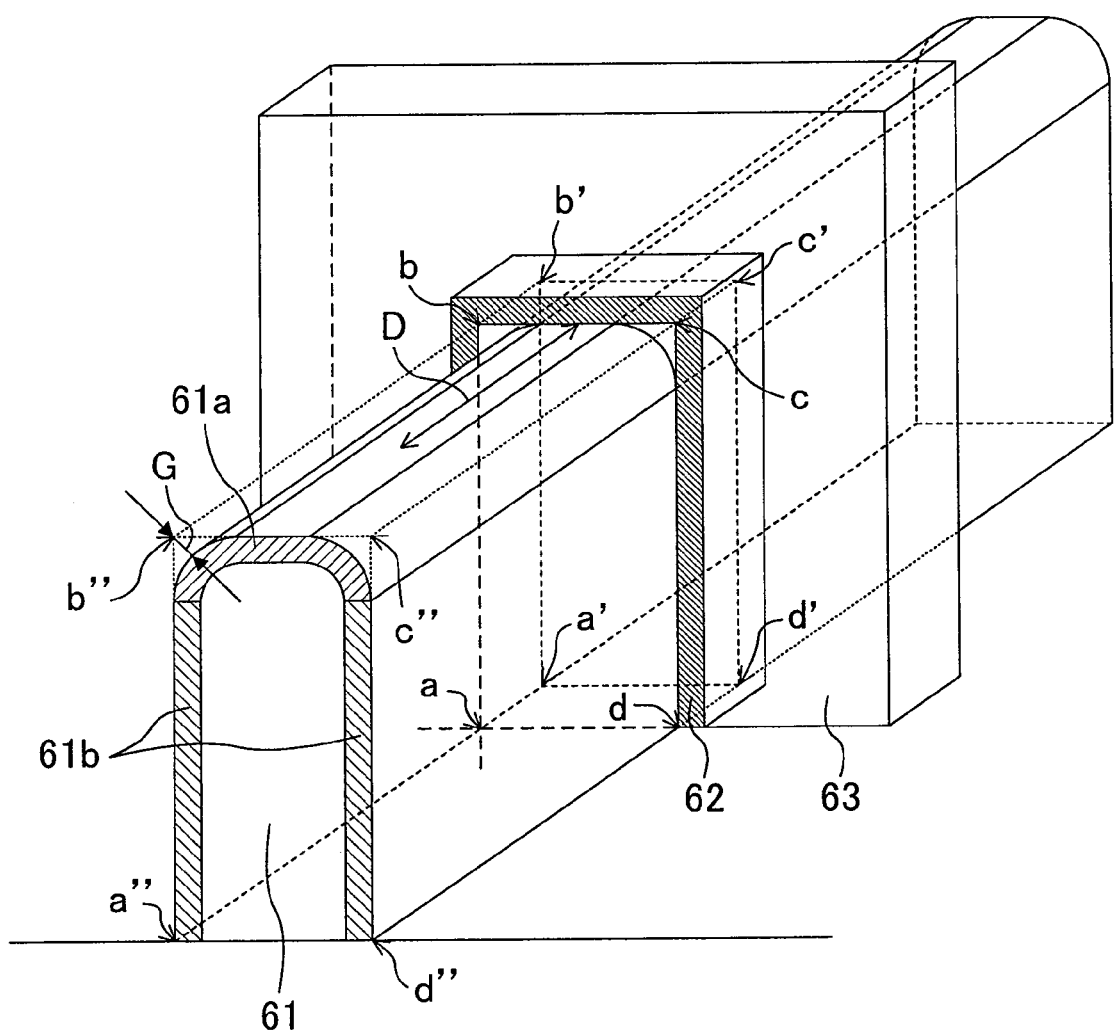
FIG. 12 is a perspective view schematically showing an example of a structure of a semiconductor device according to the first embodiment of the present invention.

FIG. 12 is a perspective view schematically showing an example of a structure of a semiconductor device obtained in the first example and the second example. Specifically, the figure shows a structure of the device before plasma doping where a gate electrode has been formed on a fin-shaped semiconductor region having a substantially right-angled upper corner with a gate insulating film interposed therebetween. As shown in FIG. 12, a gate electrode 63 is formed so as to bridge over a fin-shaped semiconductor region 61 having an impurity region 61a in an upper portion thereof and an impurity region 61b in a side portion thereof, with the gate insulating film 62 interposed therebetween. Herein, a, b, c and d denote corners on the source side along the inner wall of the gate insulating film 62 having a pommel horse shape, and a", b", c" and d" are obtained by translating the corners a, b, c and d to the source-side end surface of the fin-shaped semiconductor region 61. The height of the fin is 10-500 nm, for example, the width of the fin is 10-500 nm, for example, and the distance between fins is 20-500 nm. Where the present invention is applied to a semiconductor device having such minute fins, it is possible to realize a semiconductor device having a characteristic that the distance G between the corner b" and the first impurity region 61a (the fin upper portion), i.e., the distance G between the corner c" and the first impurity region 61a (the fin upper portion), is greater than zero and less than or equal to 10 nm and a characteristic that the sheet resistance of the second impurity region 61b (the fin side portion) normalized with the sheet resistance of the first impurity region 61a (the fin upper portion) is less than or equal to 1.25, thus obtaining effects of the present invention. Note that the distance G between the corner b" and the first impurity region 61a (the fin upper portion) or the distance G between the corner c" and the first impurity region 61a (the fin upper portion) means the maximum value of the distance between the plane including the rectangle a-a'-b'-b, the plane including the rectangle b-b'-c'-c or the plane including the rectangle c-c'-d'-d and the first impurity region 61a (where a, b, c and d are the corners on the source side along the inner wall of the gate insulating film 62 having a pommel horse shape and a', b', c' and d' are the corresponding corners on the drain side, and this is a quantity that reflects the amount of the upper corner of the fin-shaped semiconductor region chipped off by plasma doping. Moreover, the characteristic that the distance G between the corner b" and the first impurity region 61a (the fin upper portion), i.e., the distance G between the corner c" and the first impurity region 61a (the fin upper portion), is greater than zero and less than or equal to 10 nm is normally equivalent to the characteristic that the radius of curvature r' of the upper corner in a portion of the semiconductor region 61 located outside the gate insulating film 62 (i.e., the radius of curvature after plasma doping) is greater than the radius of curvature r of the upper corner in a portion of the semiconductor region 61 located under the gate insulating film 62 (i.e., the radius of curvature before plasma doping) and is less than or equal to 2r.

Figure 13:
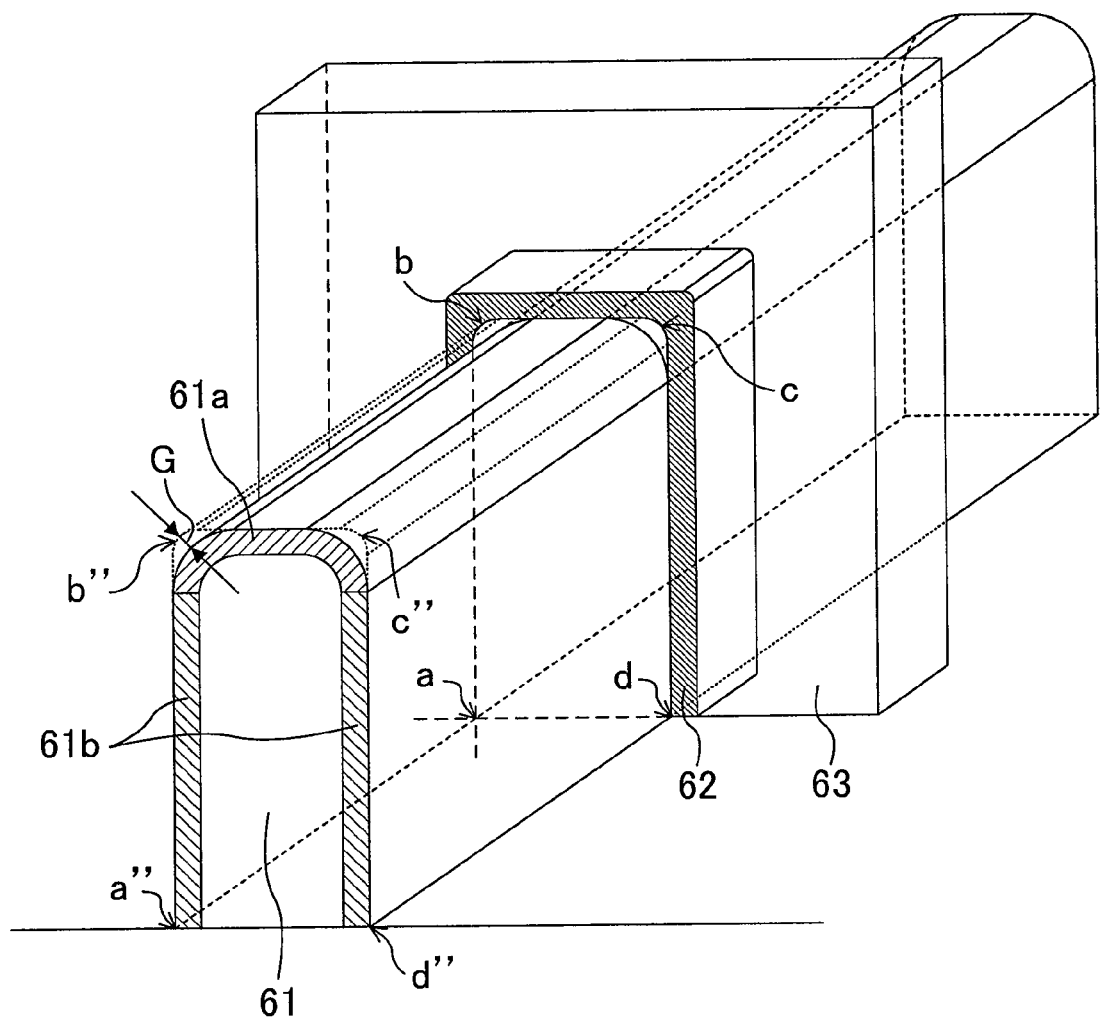
FIG. 13 is a perspective view schematically showing another example of a structure of a semiconductor device according to the first embodiment of the present invention.

FIG. 13 is a perspective view schematically showing another example of a structure of a semiconductor device obtained in the first example and the second example. Specifically, the figure shows a structure of the device where the semiconductor region is formed so that the fin corner portion in advance has some radius of curvature before the formation of the gate insulating film, and then the gate electrode is formed thereon with the gate insulating film interposed therebetween. Note that in FIG. 13, like elements to those shown in FIG. 12 are denoted by like reference numerals and will not be described redundantly. It has been pointed out that when the fin corner portion is nearly right-angled, it is difficult for a current to flow from the source to the drain through the fin corner portion. This is a problem that occurs depending on whether there is a nearly right-angled corner portion in a connecting portion between the gate insulating film 62 and the first impurity region 61a (the fin upper portion), irrespective of the presence/absence or the magnitude of the chipping of the fin corner portion by plasma doping. Therefore, in order to solve the problem, it is preferred that the fin corner portion is in advance provided with a radius of curvature from about 3 nm to about 30 nm before the formation of the gate insulating film. Then, there will not be a nearly right-angled corner portion in a connecting portion between the gate insulating film 62 and the first impurity region 61a (the fin upper portion), and it will not be difficult for a current flow from the source to the drain to flow under the gate insulating film 62. Also where the present invention is applied to a semiconductor device having such fins, it is possible to realize a semiconductor device having a characteristic that the distance G between the corner b" and the first impurity region 61a (the fin upper portion), i.e., the distance G between the corner c" and the first impurity region 61a (the fin upper portion), is greater than zero and less than or equal to 10 nm and a characteristic that the sheet resistance of the second impurity region 61b (the fin side portion) normalized with the sheet resistance of the first impurity region 61a (the fin upper portion) is less than or equal to 1.25, thus obtaining effects of the present invention.

[Plasma Apparatus Used in First Example and Second Example]

An ICP-type plasma apparatus is used in the first example and the second example. The reason is that it is then possible to use a characteristic "being a plasma with large angles of incidence of ions" that is inherent to an ICP-type plasma, whereby it becomes easier to obtain the effects of the present invention. In addition, with an ICP method, the plasma density and the implantation depth can be controlled independently, whereby it is likely to be able to generate a plasma uniformly even for a substrate having a large diameter of 300 mm, for example, without increasing the electron temperature as much as that with the ECR (electron cyclotron resonance) plasma method. Therefore, it is possible to perform a plasma doping process uniformly for a plurality of fins within the surface of a large-diameter substrate while suppressing breaking of the gate insulating film and freely choosing the implantation depth. Thus, it is desirable to use an ICP-type plasma apparatus.

Problems occurring when the present invention is carried out using other plasma methods will now be described.

First, the RIE (reactive ion etching) plasma method will be discussed. With the RIE plasma method, a high-frequency voltage is applied to the cathode electrode. Thus, the generation of a plasma starts, and the plasma density is adjusted while the bias voltage is adjusted at the same time. Where the RIE plasma method is used, the generation of a plasma starts only at a high pressure. Therefore, in order to decrease the pressure to a low pressure such as that used in the process of the present invention after the plasma generation is once started at a high pressure, the pressure adjustment requires a long period of time, thereby lowering the productivity. Moreover, with the RIE plasma method, a plasma is generated only by applying a high-frequency voltage to a cathode electrode, whereby the plasma density and the implantation depth change simultaneously, and cannot be controlled independently, thus resulting in a poor process controllability. In contrast, with the ICP method described above, the plasma density is controlled by controlling the high-frequency voltage applied to the anode electrode and the implantation depth is controlled by controlling the high-frequency voltage applied to the cathode electrode, whereby the plasma density and the implantation depth can be controlled independently. Moreover, with the ICP method described above, it is possible to set the high-frequency voltage to be applied to the anode electrode at the start of the plasma generation to be high, whereby it is possible to start the plasma generation without using a pressure significantly higher than that used in a doping process.

Next, the ECR plasma method will be discussed. In the ECR plasma method, the excitation frequency is greater than or equal to 900 MHz. Thus, with the ECR plasma method, since the excitation frequency is very high, the electron temperature is high, whereby the dielectric breakdown of the gate insulating film is likely to occur. In contrast, with the ICP method, the excitation frequency is 13.56 MHz, for example, i.e., smaller than that of the ECR plasma method by an order or magnitude or more, and the dielectric breakdown of the gate insulating film is relatively unlikely to occur. Thus, it is desirable to use the ICP method as compared with the ECR plasma method.

Next, the pulsed DC plasma method will be discussed. With the pulsed DC plasma method, a pulsed DC high-frequency voltage is applied to the cathode electrode. With this method, the angle of incidence of ions is basically close to zero (i.e., at nearly a right angle with respect to the fin upper surface), whereby the sheet resistance of the fin side portion will be higher than that of the fin upper portion. In contrast, with the ICP method, an AC high-frequency voltage whose frequency is 500 MHz, 600 MHz or 13.56 MHz is applied to the cathode electrode. Thus, the angle of incidence of ions increases, whereby the sheet resistance of the fin side portion is likely to be substantially equal to that of the fin upper portion. Thus, it is desirable to use the ICP method as compared with the pulsed DC plasma method.

Next, the helicon plasma method will be discussed. The helicon plasma method has a characteristic that a magnetic field of at least 10 gauss or more is applied to the plasma and a characteristic that the distance between the plasma source and the substrate is long. With this method, since the distance between the plasma source and the substrate is long, it is difficult to obtain a good plasma uniformity for a large-diameter substrate such as a wafer having a diameter of 300 mm. In contrast, with the ICP method, it is not necessary to apply a magnetic field to the plasma, and the distance between the plasma source and the substrate is short, whereby it is likely to be able to obtain a good plasma uniformity for a large-diameter substrate such as a wafer having a diameter of 300 mm. Thus, it is desirable to use the ICP method as compared with the helicon plasma method.

First Variation of First Embodiment

A structure of a semiconductor device according to a first variation of the first embodiment (including the first example and the second example) of the present invention will now be described with reference to the drawings.

Figure 14:
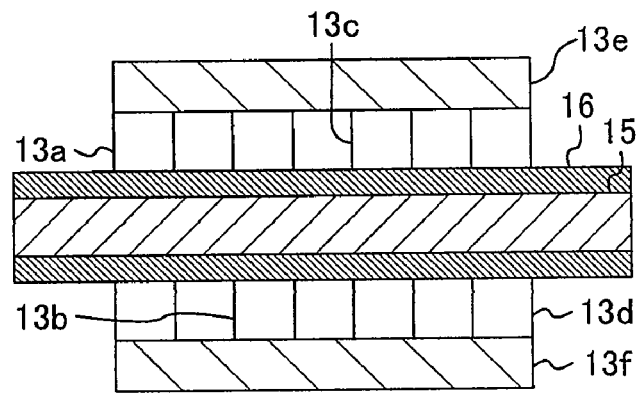
FIG. 14 is a plan view of a semiconductor device according to a first variation of the first embodiment of the present invention.

FIG. 14 is a plan view of a semiconductor device of this variation, specifically, a semiconductor device including a fin-shaped FET. Note that in FIG. 14, like elements to those of the first embodiment shown in FIGS. 1A-D are denoted by like reference numerals and will not be described redundantly.

As shown in FIG. 14, this variation differs from the first embodiment shown in FIGS. 1A-D in that other fin-shaped semiconductor regions 13e and 13f connect together end portions of the fin-shaped semiconductor regions 13a to 13d on each side of the fin-shaped semiconductor regions 13a to 13d in the gate length direction.

According to this variation, it is possible to form a single fin-shaped FET with the fin-shaped semiconductor regions 13a to 13f, while obtaining effects similar to those of the first embodiment.

Second Variation of First Embodiment

A structure of a semiconductor device according to a second variation of the first embodiment (including the first example and the second example) of the present invention will now be described with reference to the drawings.

Figure 15A:
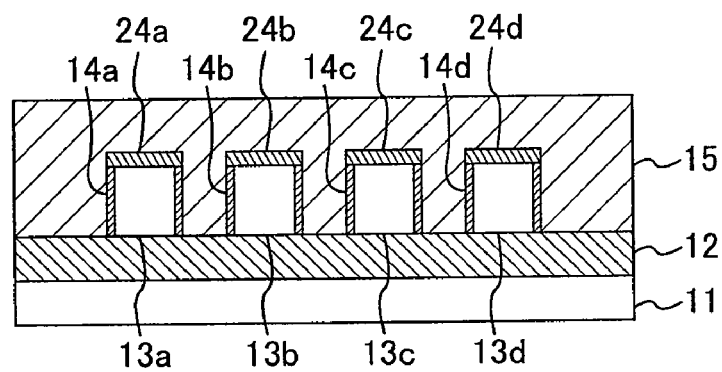
Figure 15B:
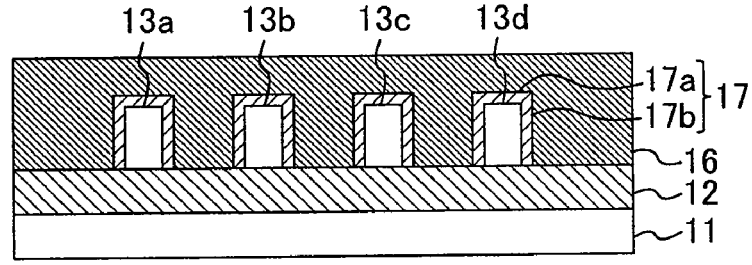
Figure 15C:
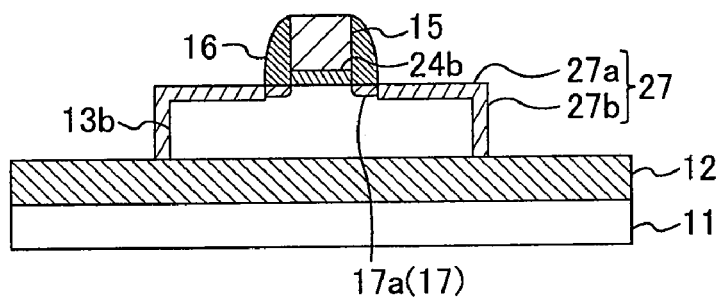

A plan view showing a structure of a semiconductor device of this variation, specifically, a semiconductor device including a fin-shaped FET, is the same as FIG. 1A being a plan view of the first embodiment. FIGS. 15A-C show cross-sectional structures of the semiconductor device of this variation, wherein FIG. 15A is a cross-sectional view taken along line A-A in FIG. 1A, FIG. 15B is a cross-sectional view taken along line B-B in FIG. 1A, and FIG. 15C is a cross-sectional view taken along line C-C in FIG. 1A.

As shown in FIGS. 15A-C, this variation differs from the first embodiment shown in FIGS. 1A-D as follows. Specifically, in the first embodiment, the gate insulating films 14a to 14d having a thickness of about 3 nm and made of a silicon oxynitride film, for example, are formed on the upper surface and the side surface of the fin-shaped semiconductor regions 13a to 13d. In contrast, in this variation, the gate insulating films 14a to 14d are formed only on the side surface of the fin-shaped semiconductor regions 13a to 13d, and insulating films 24a to 24d having a thickness of 20 nm and made of a silicon oxide film, for example, are formed on the upper surface of the fin-shaped semiconductor regions 13a to 13d.

Thus, in this variation, only the side portion of the fin-shaped semiconductor regions 13a to 13d is used as a channel region. Also with such a structure, it is possible to obtain effects similar to those of the first embodiment if the aspect ratio ("the height of the side surface of the fin-shaped semiconductor region"/"the width of the upper surface of the fin-shaped semiconductor region in the gate width direction") is large.

First Comparative Example

In the first comparative example, plasma doping is performed under a condition where the pressure during plasma doping is set to be greater than or equal to 0.6 Pa and less than or equal to 10 Pa and the ion current density Ii (mA/cm$^2$) and the pressure during plasma doping P(Pa) satisfy Ii$\geq$0.51 Ln(P)+0.80 (see FIG. 10A). Note that Ln represents a natural logarithm.

The first comparative example used a sample similar to that of the first example as shown in FIG. 4A as a fin-shaped semiconductor region (before plasma doping is performed) for examining the amount of chipping of the fin corner portion. Specifically, the size, shape, etc., of the fins before plasma doping are the same as those of the second example, and the radius of curvature of the fin corner portion before plasma doping is 8.7 nm. The methods for measuring and evaluating the electron temperature, the ion current density, etc., are the same as those of the second example.

First, the amount of chipping of the fin corner portion is measured while varying the pressure and the source power during plasma doping. The plasma doping condition is such that the bias power is 135 W (the bias voltage Vpp is 290 V), the material gas is B$_2$H$_6$ diluted with He, the B$_2$H$_6$ concentration in the material gas is 0.05% by mass, the total flow rate of the gas is 300 cc/min (standard state), and the bias application time is 60 seconds. Note that the boron implantation depth, defined as the depth at which the boron concentration is $5 \times 10^{18}$ cm$^{-3}$, is about 9 nm.

After plasma doping under such a condition, the fin corner portion was substantially chipped off. Specifically, the amount of chipping of the fin corner portion per minute of a plasma doping process was 8.7 nm/min or more. Therefore, the radius of curvature of the fin corner portion after plasma doping is greater than or equal to twice that before plasma doping, indicating that the amount of chipping of the fin corner portion is over an acceptable range.

Figure 16:
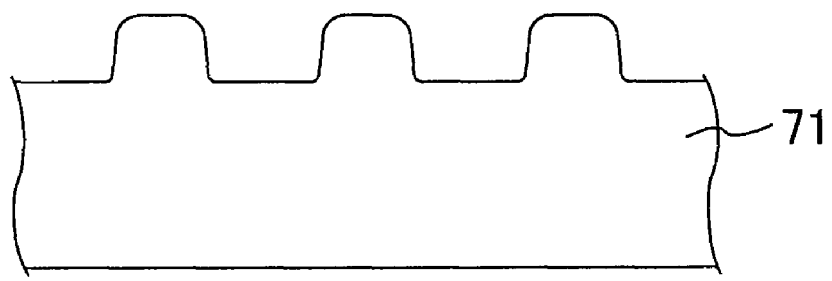
FIG. 16 schematically shows a cross-sectional shape of a fin-shaped semiconductor region after plasma doping according to a first comparative example.
Figure 17A:
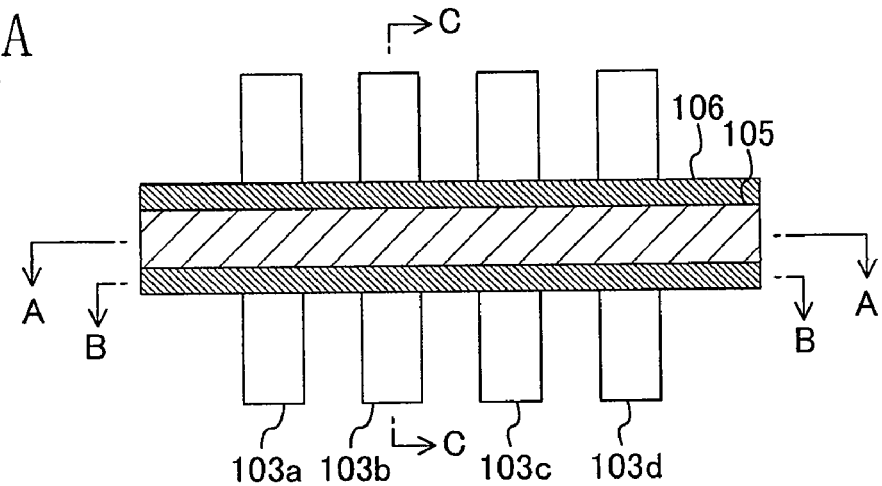
Figure 17B:
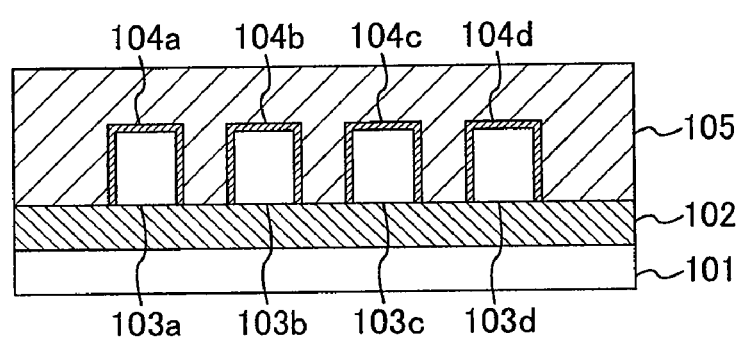
Figure 17C:
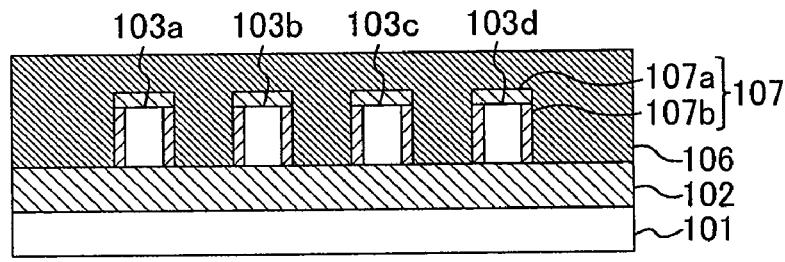
Figure 17D:
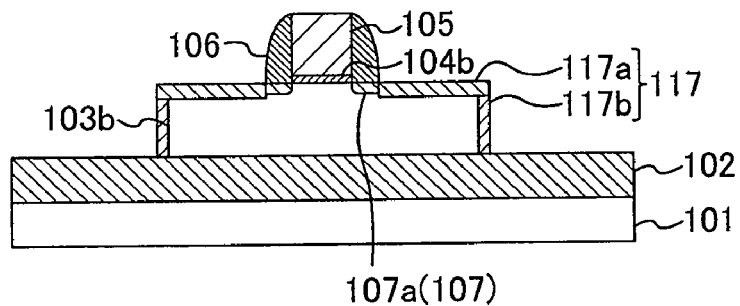
Figure 18A:
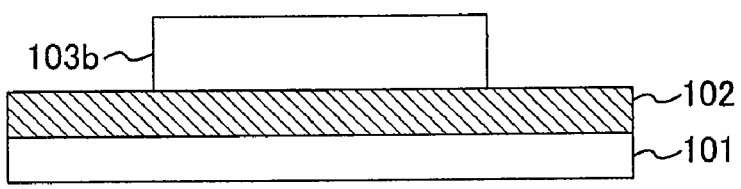
FIGS. 18A-D are cross-sectional views showing step by step a conventional method for producing a semiconductor device.
Figure 18B:
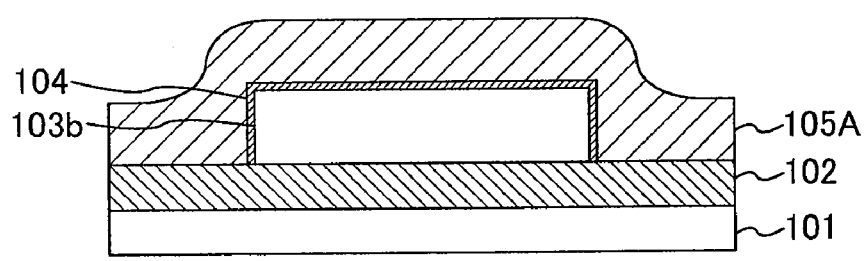
Figure 18C:
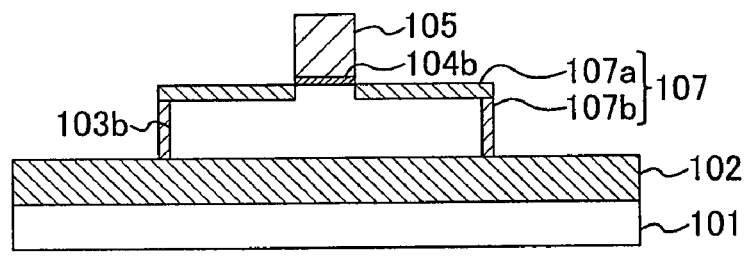
Figure 18D:
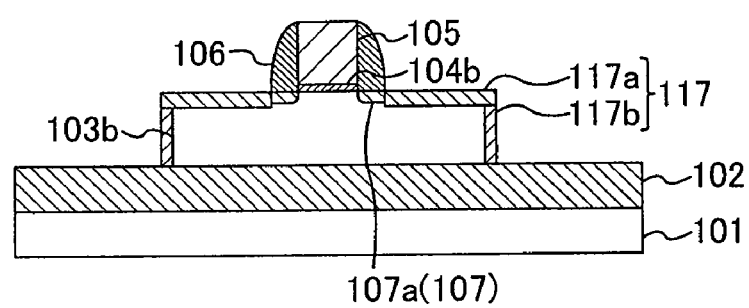
Figure 19A:
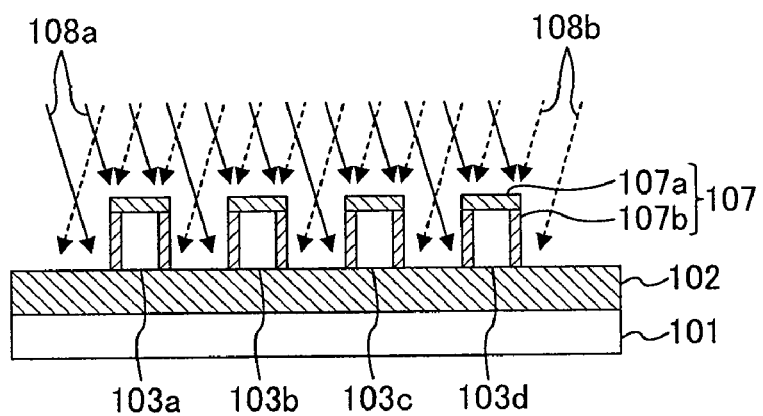
FIG. 19A is a cross-sectional view showing the step of forming a source-drain region of a fin-shaped FET as described in Patent Document 1.
Figure 19B:
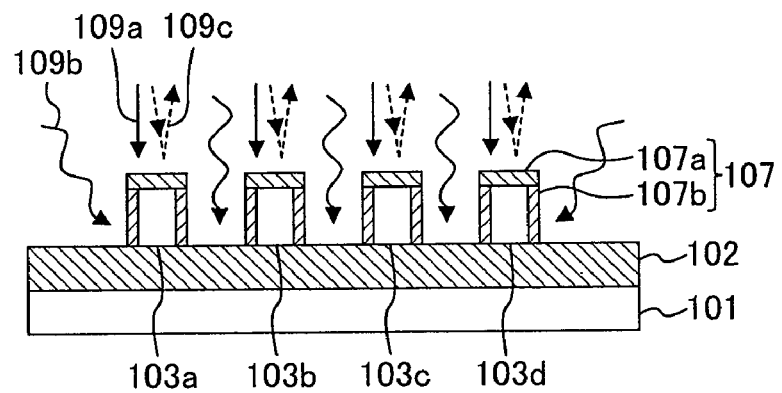
FIG. 19B is a cross-sectional view showing the step of forming a source-drain region of a fin-shaped FET as described in Non-Patent Document 1.
Figure 20A:
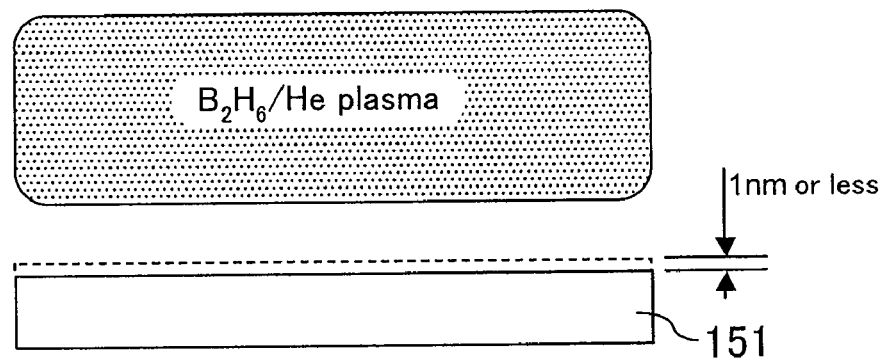
FIG. 20A shows the amount of chipping where a plasma doping method disclosed in Patent Document 2 is applied to a flat semiconductor region.
Figure 20B:
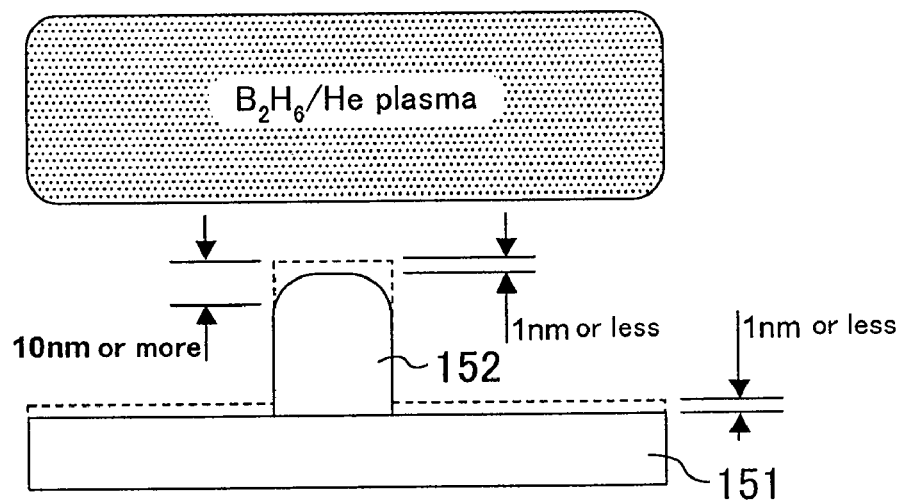
FIG. 20B shows the amount of chipping where a plasma doping method disclosed in Patent Document 2 is applied to a fin-shaped semiconductor region.

FIG. 16 schematically shows a typical example of a cross-sectional shape of a fin-shaped semiconductor region (strictly, a semiconductor region 71 having fins) after plasma doping is performed in the first comparative example. The plasma doping condition is such that the bias power is 135 W (the bias voltage Vpp is 290 V), the material gas is B$_2$H$_6$ diluted with He, the B$_2$H$_6$ concentration in the material gas is 0.05% by mass, the total flow rate of the gas is 300 cc/min (standard state), the bias application time is 200 seconds, the pressure is 0.9 Pa, and the ion current density is 0.9 mA/cm$^2$. The radius of curvature of the fin corner portion (the region indicated by a broken line in the figure) after plasma doping was performed under such a condition was as great as 46.6 nm. Since the radius of curvature of the fin corner portion before plasma doping was 8.7 nm, the amount of chipping of the fin corner portion per minute of a plasma doping process was 11.4 nm/min. This is such an amount of chipping that the radius of curvature of the fin corner portion increases by two times or more through a plasma doping process for one minute. Thus, in the first comparative example, the gap between the gate insulating film and the impurity region will be large. Therefore, when a current flows from the source to the drain through a portion under the gate insulating film, it is difficult for a current to flow near the boundary between the first impurity region (the fin upper portion) and the second impurity region (the fin side portion), thereby failing to obtain effects of the present invention.

Second Comparative Example

In the second comparative example, plasma doping is performed while setting the pressure during plasma doping to be greater than or equal to 10 Pa. In such a case, even if the ion current density was set to be very small by setting the source power to be low, it was not possible to suppress the amount of chipping of the fin corner portion so that the radius of curvature of the fin corner portion after plasma doping is less than or equal to twice that before plasma doping. When a load was applied on the apparatus in an attempt to forcibly decrease the ion current density, it was not possible to maintain a plasma, making it difficult to carry out the plasma doping. Therefore, the second comparative example also fails to obtain effects of the present embodiment.

INDUSTRIAL APPLICABILITY

The present invention relates to a semiconductor device and a method for producing the same, and more particularly is useful in realizing a semiconductor device of a three-dimensional structure including fin-shaped semiconductor regions on a substrate with which desirable characteristics can be obtained.

What is claimed is:

1. A semiconductor device, comprising:
   a first semiconductor region formed on a substrate and having an upper surface and a side surface;
   a first impurity region of a first conductivity type formed in an upper portion of the first semiconductor region;
   a second impurity region of a first conductivity type formed in a side portion of the first semiconductor region;
   a gate insulating film formed so as to cover at least a side surface and an upper corner of a predetermined portion of the first semiconductor region;
   a gate electrode formed on the gate insulating film;
   an insulative sidewall spacer formed on a side surface of the gate electrode;
   a third impurity region of a first conductivity type formed in an upper portion of the first semiconductor region; and
   a fourth impurity region of a first conductivity type formed in a side portion of the first semiconductor region, wherein:
   the first impurity region and the second impurity region are formed in another portion of the first semiconductor region other than the predetermined portion,
   the third impurity region and the fourth impurity region are formed in a portion of the first semiconductor region which is located outside the insulative sidewall spacer and is provided in the other portion of the first semiconductor region, and
   a radius of curvature r' of an upper corner of a portion of the first semiconductor region located outside the gate insulating film is greater than a radius of curvature r of an upper corner of a portion of the first semiconductor region located under the gate insulating film and is less than or equal to 2r.

2. The semiconductor device of claim 1, wherein a sheet resistance of the second impurity region is less than or equal to 1.25 times that of the first impurity region.

3. The semiconductor device of claim 1, wherein a specific resistance of the second impurity region is less than or equal to 1.25 times that of the first impurity region.

4. The semiconductor device of claim 1, wherein a spreading resistance of the second impurity region is less than or equal to 1.25 times that of the first impurity region.

5. The semiconductor device of claim 1, wherein a junction depth of the second impurity region is substantially equal to or greater than that of the first impurity region.

6. The semiconductor device of claim 1, wherein the first semiconductor region has a fin shape.

7. The semiconductor device of claim 1, wherein the first semiconductor region is formed on an insulating layer formed on the substrate.

8. The semiconductor device of claim 1, wherein the gate insulating film is formed also on an upper surface of the first semiconductor region in the predetermined portion of the first semiconductor region.

9. The semiconductor device of claim 1, wherein the first impurity region and the second impurity region are a P-type extension region.

10. The semiconductor device of claim 1,
    wherein:
    a sheet resistance of the fourth impurity region is less than or equal to 1.25 times that of the third impurity region.

11. The semiconductor device of claim 1, wherein the third impurity region and the fourth impurity region are a P-type source-drain region.

12. The semiconductor device of claim 1,
    wherein the first impurity region and the second impurity region are formed in a portion of the first semiconductor region which is located under the insulative sidewall spacer.

13. The semiconductor device of claim 1, wherein a height of the side surface of the first semiconductor region is greater than a width of the upper surface of the first semiconductor region in a gate width direction.

14. A semiconductor device, comprising:
    a plurality of semiconductor regions formed on a substrate and each having an upper surface and a side surface;
    a first impurity region of a first conductivity type formed in an upper portion of each of the plurality of semiconductor regions;
    a second impurity region of a first conductivity type formed in a side portion of each of the plurality of semiconductor regions; and
    a gate insulating film formed so as to cover at least a side surface and an upper corner of a predetermined portion of each of the plurality of semiconductor regions;
    a gate electrode formed on the gate insulating film in each of the plurality of semiconductor regions;
    an insulative sidewall spacer formed on a side surface of the gate electrode in each of the plurality of semiconductor regions;
    a third impurity region of a first conductivity type formed in an upper portion of the first semiconductor region in each of the plurality of semiconductor regions; and
    a fourth impurity region of a first conductivity type formed in a side portion of the first semiconductor region in each of the plurality of semiconductor regions, wherein:
    the first impurity region and the second impurity region are formed in another portion of the first semiconductor region other than the predetermined portion in each of the plurality of semiconductor regions,
    the third impurity region and the fourth impurity region are formed in a portion of the first semiconductor region which is located outside the insulative sidewall spacer and is provided in the other portion of the first semiconductor region in each of the plurality of semiconductor regions, and
    a radius of curvature r' of each upper corner of portions of the plurality of semiconductor regions located outside the plurality of gate insulating films is greater than a radius of curvature r of each upper corner of portions of the plurality of semiconductor regions located under the plurality of gate insulating films and is less than or equal to 2r.

15. The semiconductor device of claim 14, wherein a sheet resistance of the second impurity region is less than or equal to 1.25 times that of the first impurity region.

16. The semiconductor device of claim 14, wherein a specific resistance of the second impurity region is less than or equal to 1.25 times that of the first impurity region.

17. The semiconductor device of claim 14, wherein a spreading resistance of the second impurity region is less than or equal to 1.25 times that of the first impurity region.

18. The semiconductor device of claim 14,
wherein the gate electrode extends across the plurality of semiconductor regions in a gate width direction.

19. The semiconductor device of claim 14, wherein the first impurity region and the second impurity region are a P-type extension region.

20. The semiconductor device of claim 14, wherein the third impurity region and the fourth impurity region are a P-type source-drain region.

21. The semiconductor device of claim 14, further comprising a third semiconductor region connecting together end portions of the plurality of semiconductor regions on each side of the semiconductor regions in a gate length direction.

22. The semiconductor device of claim 14, wherein a sheet resistance of the fourth impurity region is less than or equal to 1.25 times that of the third impurity region.

* * * * *

UNITED STATES PATENT AND TRADEMARK OFFICE
CERTIFICATE OF CORRECTION

| | | |
|---|---|---|
| PATENT NO. | : 8,063,437 B2 | Page 1 of 1 |
| APPLICATION NO. | : 12/193861 | |
| DATED | : November 22, 2011 | |
| INVENTOR(S) | : Yuichiro Sasaki et al. | |

It is certified that error appears in the above-identified patent and that said Letters Patent is hereby corrected as shown below:

In item 56, References Cited, page 2, U.S. Patent Documents, the second reference reads "2006/1015774" but should read -- 2006/0157749 --.

Signed and Sealed this
Eighth Day of May, 2012

David J. Kappos
*Director of the United States Patent and Trademark Office*